(12) United States Patent
Makhervaks et al.

(10) Patent No.: US 9,559,990 B2
(45) Date of Patent: Jan. 31, 2017

(54) SYSTEM AND METHOD FOR SUPPORTING HOST CHANNEL ADAPTER (HCA) FILTERING IN AN ENGINEERED SYSTEM FOR MIDDLEWARE AND APPLICATION EXECUTION

(71) Applicant: Oracle International Corporation, Redwood Shores, CA (US)

(72) Inventors: Vadim Makhervaks, Bellevue, WA (US); Bjørn Dag Johnsen, Oslo (NO); David M. Brean, Boston, MA (US); Richard P. Mousseau, Stratham, NH (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 37 days.

(21) Appl. No.: 14/467,896

(22) Filed: Aug. 25, 2014

(65) Prior Publication Data
US 2015/0063356 A1  Mar. 5, 2015

Related U.S. Application Data

(60) Provisional application No. 61/870,693, filed on Aug. 27, 2013.

(51) Int. Cl.
*H04L 12/28* (2006.01)
*H04L 12/861* (2013.01)
(Continued)

(52) U.S. Cl.
CPC ........ *H04L 49/9036* (2013.01); *H03M 13/093* (2013.01); *H03M 13/3761* (2013.01);
(Continued)

(58) Field of Classification Search
CPC ...... H04L 49/9036; H04L 49/25; H04L 45/24; H04L 45/74; H04L 49/35
(Continued)

(56) References Cited

U.S. PATENT DOCUMENTS 4,304,001 A * 12/1981 Cope .................. G05B 19/0428
340/2.9
7,983,265 B1    7/2011 Dropps
(Continued)

OTHER PUBLICATIONS

European Patent Office, International Searching Authority, International Search Report and Written Opinion dated Dec. 22, 2014 for International Application No. PCT/US2014/052723, 10 pages.
(Continued)

*Primary Examiner* — Sai-Ming Chan
(74) *Attorney, Agent, or Firm* — Tucker Ellis LLP

(57) ABSTRACT

A system and method can provide a data service in a network environment. The network environment can include a node, which supports a data service component that can provide a data service. Additionally, a filter can be provided on a networking device, such as a host channel adaptor (HCA) that is associated with the node. The networking device operates to use the filter to identify one or more packets targeting the data service component without protocol termination. Furthermore, the filter can forward said one or more packets to the data service component.

20 Claims, 17 Drawing Sheets

(51) Int. Cl.
*H04L 12/947* (2013.01)
*H04L 12/741* (2013.01)
*H03M 13/09* (2006.01)
*H03M 13/37* (2006.01)
*H04L 12/931* (2013.01)
*H04L 12/717* (2013.01)

(52) U.S. Cl.
CPC .............. *H04L 45/74* (2013.01); *H04L 49/25* (2013.01); *H04L 49/35* (2013.01); *H04L 45/42* (2013.01)

(58) Field of Classification Search
USPC ........................................................ 370/392
See application file for complete search history.

(56) References Cited

U.S. PATENT DOCUMENTS

| | | | |
|---|---|---|---|
| 2003/0208531 A1* | 11/2003 | Matters | H04L 29/06 709/203 |
| 2006/0155880 A1 | 7/2006 | Elnozahy | |
| 2008/0282335 A1 | 11/2008 | Abzarian | |
| 2010/0037309 A1* | 2/2010 | Dargis | H04L 63/0272 726/13 |
| 2010/0284403 A1 | 11/2010 | Scudder | |
| 2011/0276661 A1 | 11/2011 | Gujarathi | |
| 2012/0284786 A1 | 11/2012 | Somani et al. | |
| 2013/0019302 A1 | 1/2013 | Johnsen et al. | |
| 2013/0051232 A1 | 2/2013 | Gavrilov et al. | |
| 2013/0223447 A1 | 8/2013 | Kahng | |
| 2013/0223449 A1 | 8/2013 | Koganti | |
| 2013/0259033 A1 | 10/2013 | Hefty | |
| 2013/0315102 A1 | 11/2013 | Kahng | |
| 2013/0315237 A1* | 11/2013 | Kagan | H04L 47/2408 370/389 |
| 2014/0019571 A1* | 1/2014 | Cardona | G06F 13/28 709/212 |
| 2014/0056298 A1 | 2/2014 | Vobbilisetty | |
| 2014/0177639 A1 | 6/2014 | Vershkov | |
| 2014/0188996 A1 | 7/2014 | Lie | |

OTHER PUBLICATIONS

European Patent Office, International Searching Authority, International Search Report and Written Opinion dated Nov. 9, 2015 for International Application No. PCT/US2015/049193, 11 pages.
United States Patent and Trademark Office, Office Action dated May 16, 2016 for U.S. Appl. No. 14/467,868, 10 Pages.
United States Patent and Trademark Office, Office Action dated Sep. 9, 2016 for U.S. Appl. No. 14/467,860, 17 Pages.
United States Patent and Trademark Office, Office Action dated Dec. 15, 2016 for U.S. Appl. No. 14/467,859, 12 Pages.

* cited by examiner

US 9,559,990 B2

SYSTEM AND METHOD FOR SUPPORTING HOST CHANNEL ADAPTER (HCA) FILTERING IN AN ENGINEERED SYSTEM FOR MIDDLEWARE AND APPLICATION EXECUTION

CLAIM OF PRIORITY

This application claims priority on U.S. Provisional Patent Application No. 61/870,693, entitled "SYSTEM AND METHOD FOR PROVIDING NATIVE DATA SERVICE IN AN ENGINEERED SYSTEM FOR MIDDLEWARE AND APPLICATION EXECUTION" filed Aug. 27, 2013, which application is herein incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO RELATED APPLICATIONS

This application is related to the following patent application(s), each of which is hereby incorporated by reference in its entirety:

U.S. patent application titled "SYSTEM AND METHOD FOR PROVIDING A DATA SERVICE IN AN ENGINEERED SYSTEM FOR MIDDLEWARE AND APPLICATION EXECUTION", application Ser. No. 14/467,859, filed Aug. 25, 2014;

U.S. patent application titled "SYSTEM AND METHOD FOR CONTROLLING A DATA FLOW IN AN ENGINEERED SYSTEM FOR MIDDLEWARE AND APPLICATION EXECUTION", application Ser. No. 14/467,860, filed Aug. 25, 2014; and U.S. patent application titled "SYSTEM AND METHOD FOR SUPPORTING DATA SERVICE ADDRESSING IN AN ENGINEERED SYSTEM FOR MIDDLEWARE AND APPLICATION EXECUTION", application Ser. No. 14/467,868, filed Aug. 25, 2014.

FIELD OF INVENTION

The present invention is generally related to computer systems, and is particularly related to an engineered system for middleware and application execution or a middleware machine environment.

BACKGROUND

The interconnection network plays a beneficial role in the next generation of super computers, clusters, and data centers. For example, the InfiniBand (IB) technology has seen increased deployment as the foundation for a cloud computing fabric. As larger cloud computing architectures are introduced, the performance and administrative bottlenecks associated with the traditional network and storage have become a significant problem.

This is the general area that embodiments of the invention are intended to address.

SUMMARY

Described herein are systems and methods that can provide a data service in a network environment, such as an engineered system for middleware and application execution or a middleware machine environment. The network environment can include a node, which supports a data service component that can provide a data service. Additionally, a filter can be provided on a networking device, such as a host channel adaptor (HCA) that is associated with the node. The networking device operates to use the filter to identify one or more packets targeting the data service component without protocol termination. Furthermore, the filter can forward said one or more packets to the data service component.

DETAILED DESCRIPTION

Described herein are systems and methods that can provide one or more data services in an engineered system for middleware and application execution (or a middleware machine environment).

A Data Service for Handling the Native Data

In accordance with an embodiment of the invention, a data service component (such as a data service appliance and/or a data service server) can provide various types of data services in a network environment, e.g. an engineered system for middleware and application execution (or a middleware machine environment).

Figure 1:
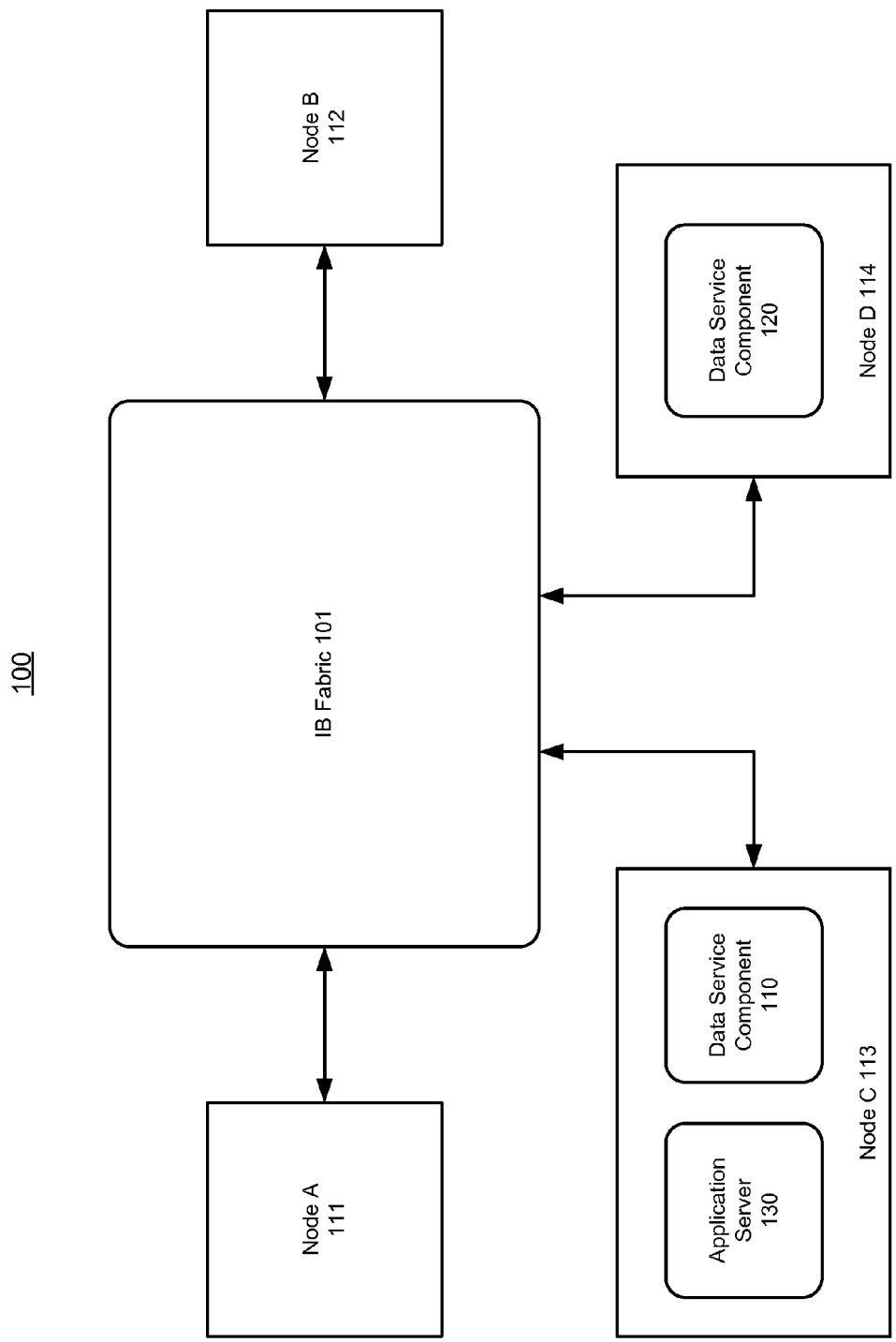
FIG. 1 shows an illustration of providing a data service appliance for handling native data in a network environment, in accordance with an embodiment of the invention.

FIG. 1 shows an illustration of providing a data service appliance for handling native data in a network environment, in accordance with an embodiment of the invention. As shown in FIG. 1, a plurality of nodes, e.g. nodes A-D 111-114, can be interconnected in a network environment 100, e.g. via an INFINIBAND (IB) fabric 101.

Furthermore, a data service component 110, which resides on the node C 113, can provide various data services for the data flow on the IB fabric 101. For example, the data flow between the nodes A 111 and the node B 112 can be a native data flow. This native data flow can access or consume the data services, which are provided by the data service component 110 on the intermediate node C 113. Thus, the native data in the IB fabric 101 can be handled without a need to leave the IB fabric 101.

In accordance with an embodiment of the invention, the data service component 110 can provide a software firewall (FWL) service, which can be used for monitoring and inspecting all types of network traffic in the network environment 100. Additionally, the data service component 110 can be used for other purposes, such as for performing traffic routing in the network environment.

Furthermore, multiple instances of a data service component (or multiple data service components) can be deployed in the same IB fabric 101 for providing high availability (HA) and improving performance. As shown in FIG. 1, another data service component 120 can reside on the node D 114 on the IB fabric 101. Both the data service component 110 and the data service component 120 can be simultaneously running on the IB fabric 101.

In accordance with an embodiment of the invention, a data service component can either be dedicated to providing the data service or be configured to share the same physical machine with other application virtual servers. As shown in FIG. 1, the node C 113, which hosts the data service component 110, may host an application server 130. Thus, the node C 113 can be used for supporting different application workloads. For example, the node C 113 can host virtual machines running these application workloads. On the other hand, the node D 114, which hosts the data service component 120, may be dedicated to providing the data services.

Moreover, the system can support different topological configurations in the network environment 100. For example, the node C 113 can play the role as both a source node and a destination node, in addition to the role as an intermediate node for supporting communication between other nodes. Thus, a single node C 113, can support different types of workloads, including the source workload, the destination workload, and the data service appliance workload.

In accordance with an embodiment of the invention, the system can deploy a data service component 110 or 120 in a virtual machine (VM) as a virtual appliance (i.e. a data service appliance) in a virtualized environment. Alternatively, the system can physically deploy a data service appliance 110 or 120 on a node as a data service server in a non-virtualized environment.

Furthermore, the traffic in the IB fabric 101 can be selectively directed to the data service component 110 or 120 for data processing (e.g. based on an evaluation of the resolved address of the target endpoint). For example, the data packets can be directed to the node C 113 (or the node D 114) using different routing algorithms for a native packet forwarding mechanism. Also, the traffic in the IB fabric 101 can be selectively directed to a data service appliance based on the resolution of the VM.

Figure 2:
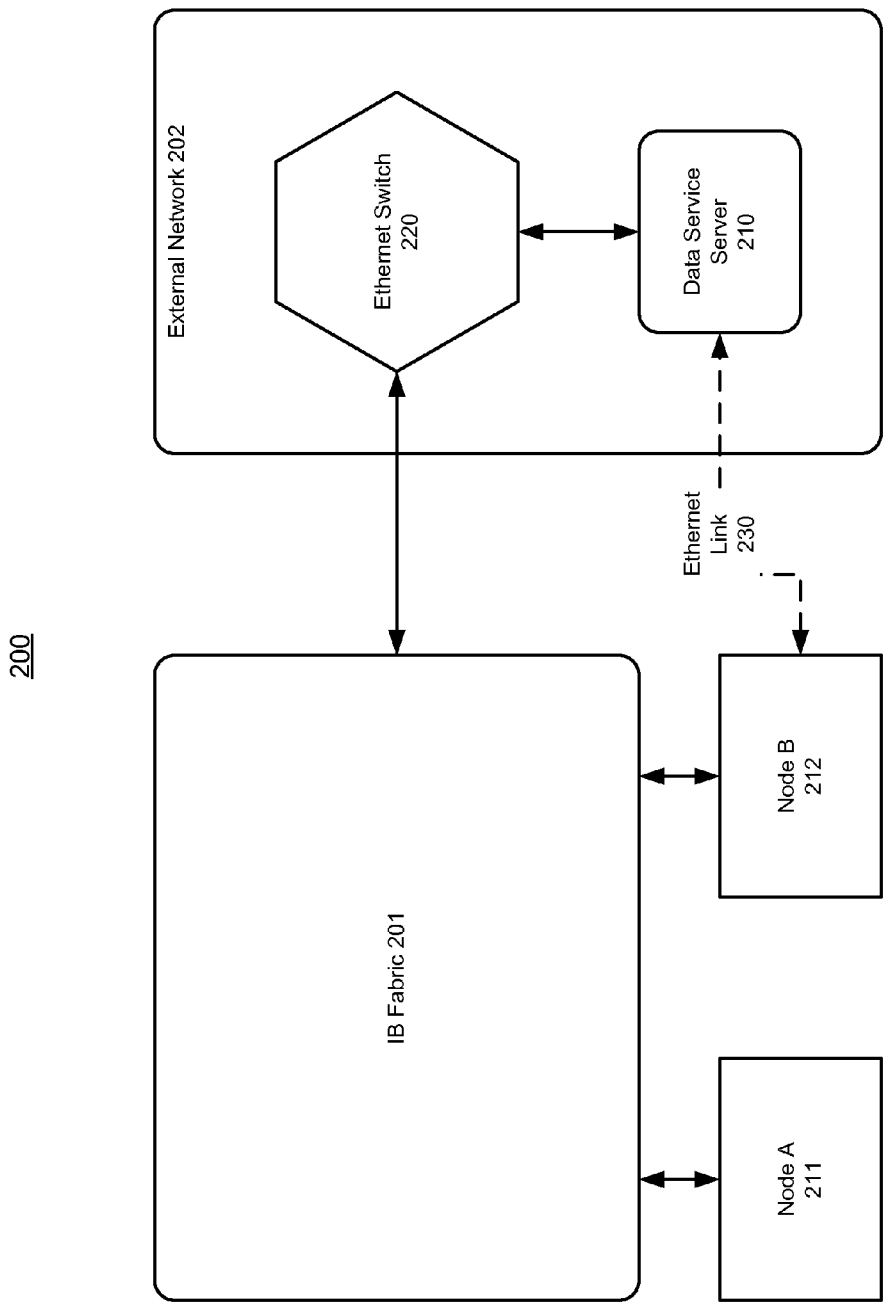
FIG. 2 shows an illustration of using an external network connection for providing data service in a network environment, in accordance with an embodiment of the invention.

FIG. 2 shows an illustration of using an external network connection for providing data service in a network environment, in accordance with an embodiment of the invention. As shown in FIG. 2, a plurality of nodes, e.g. nodes A-B 211-212, can be interconnected in a network environment 200, e.g. via an INFINIBAND (IB) fabric 201.

In accordance with an embodiment of the invention, a data service server 210 can be provided in an external network 202 (e.g. an external Ethernet network). In such a case, the data flow may need to leave the IB fabric 201, before being processed by the data service server 210 in the external network 202 and returned to the IB fabric 201 afterwards.

Furthermore, the system can use different mechanisms for connecting the data service server 210 in the external network 202 to the IB fabric 201. As shown in FIG. 2, the data service server 210 may be connected to the IB fabric 201 via an Ethernet switch 220. Alternatively, the data service server 210 may be connected to the IB fabric 201, via an Ethernet link 230 to the node B 212 on the IB fabric 201.

Figure 3:
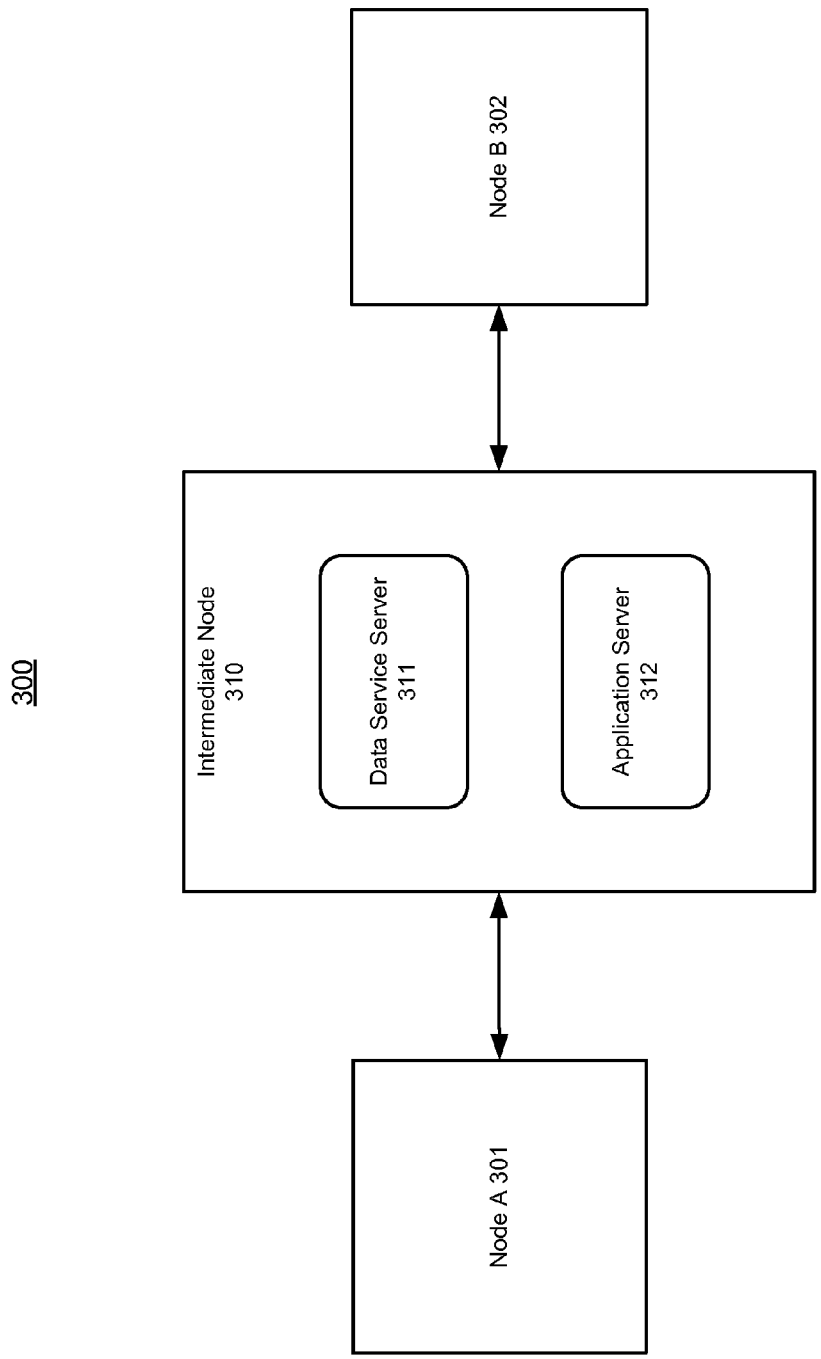
FIG. 3 shows an illustration of providing a data service for a bump on the wire (BoW) mode in a network environment, in accordance with an embodiment of the invention.

FIG. 3 shows an illustration of providing a data service for a bump on the wire (BoW) mode in a network environment, in accordance with an embodiment of the invention. As shown in FIG. 3, a data service server 311, which can provide various data services (e.g. a firewall service) in a network environment 300, can reside on an intermediate node 310.

In accordance with an embodiment of the invention, the intermediate node 310 can be physically located between two communicating parties (or end points), e.g. the node A 301 and the node B 302. Thus, the data flow between the node A 301 and the node B 302 may be forced to pass through the data service server 311 on the intermediate node 310.

Additionally, the intermediate node 310 can include another application server 312. In such a case, the system can use reverse filtering rules for determining which data packets in a data flow should be processed by the data service server 311.

Figure 4:
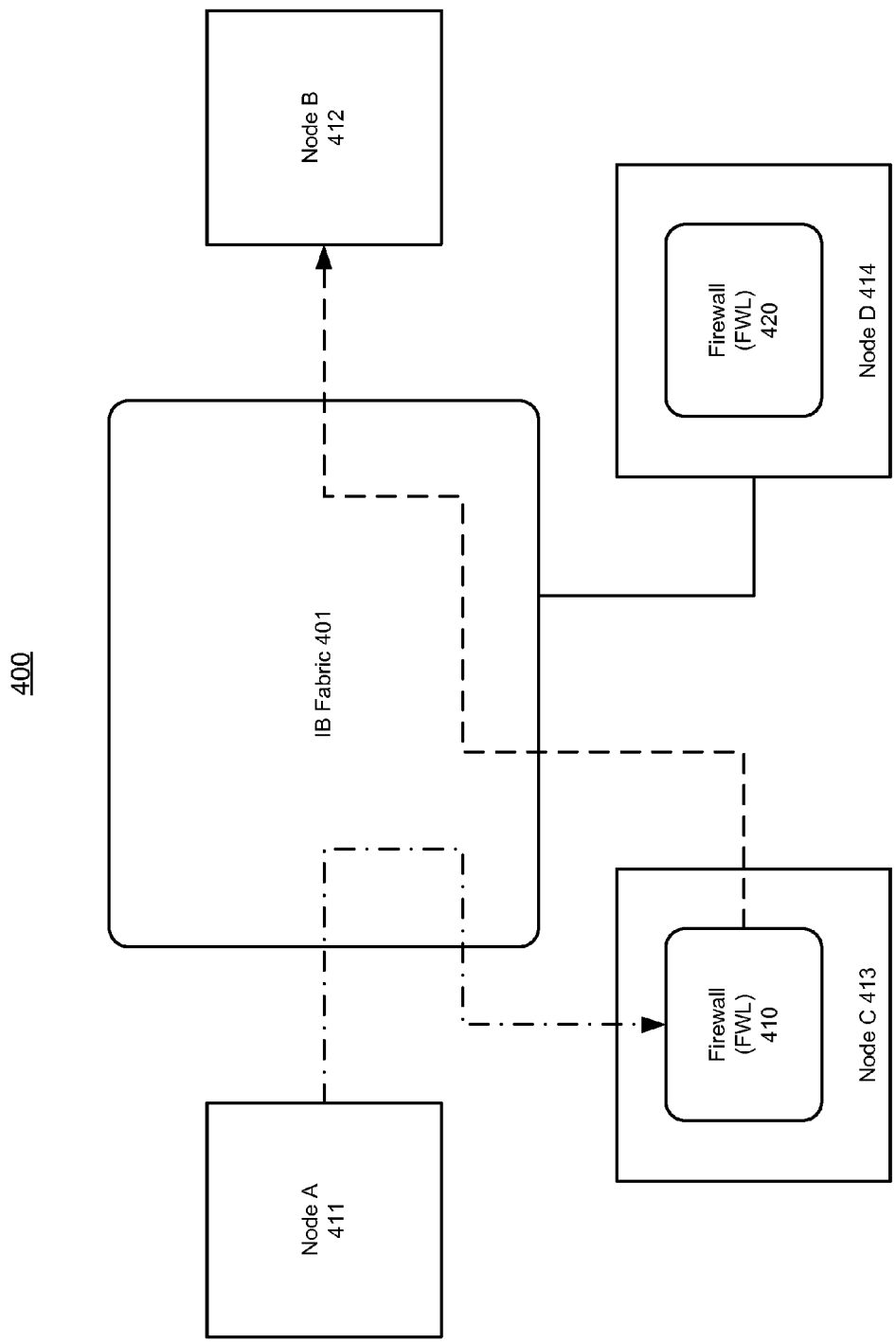
FIG. 4 shows an illustration of providing a software firewall (FWL) in a network environment, in accordance with an embodiment of the invention.

FIG. 4 shows an illustration of providing a software firewall (FWL) in a network environment, in accordance with an embodiment of the invention. As shown in FIG. 4, a plurality of nodes, e.g. nodes A-D 411-414, can be interconnected in a network environment 400, e.g. via an INFINIBAND (IB) fabric 401.

Furthermore, multiple software FWL appliances can be deployed in the IB fabric 401 for providing high availability (HA) and improving performance. For example, a FWL 410 can reside on the node C 413 and a FWL 420 can reside on the node D 414.

As shown in FIG. 4, the traffic between the node A 411 and the node B 412 in the IB fabric 401 can be directed to the FWL 410 for inspection without leaving the IB fabric 401. The FWL 410 can decide whether to forward the data packets, which are received from the source node A 411, to the destination node B 412 or drop the data packets.

In accordance with an embodiment of the invention, the FWL 410 can monitor and inspect various types of traffic in the IB fabric 401. For example, the IB traffic in the Oracle Exalogic engineered system can include the internet protocol over INFINIBAND (IPoIB) traffic, the Ethernet over INFINIBAND (EoIB) traffic, the private virtual interconnect (PVI) traffic, the sockets direct protocol (SDP) traffic, and the user-space/remote direct memory access (RDMA) traffic. Such traffic can be based on various transport protocols, such as the unreliable datagram (UD) transport protocol, the reliable connection (RC) transport protocol, the unreliable connection (UC) transport protocol, the reliable datagram (RD transport protocol and the raw transport protocol.

Figure 5:
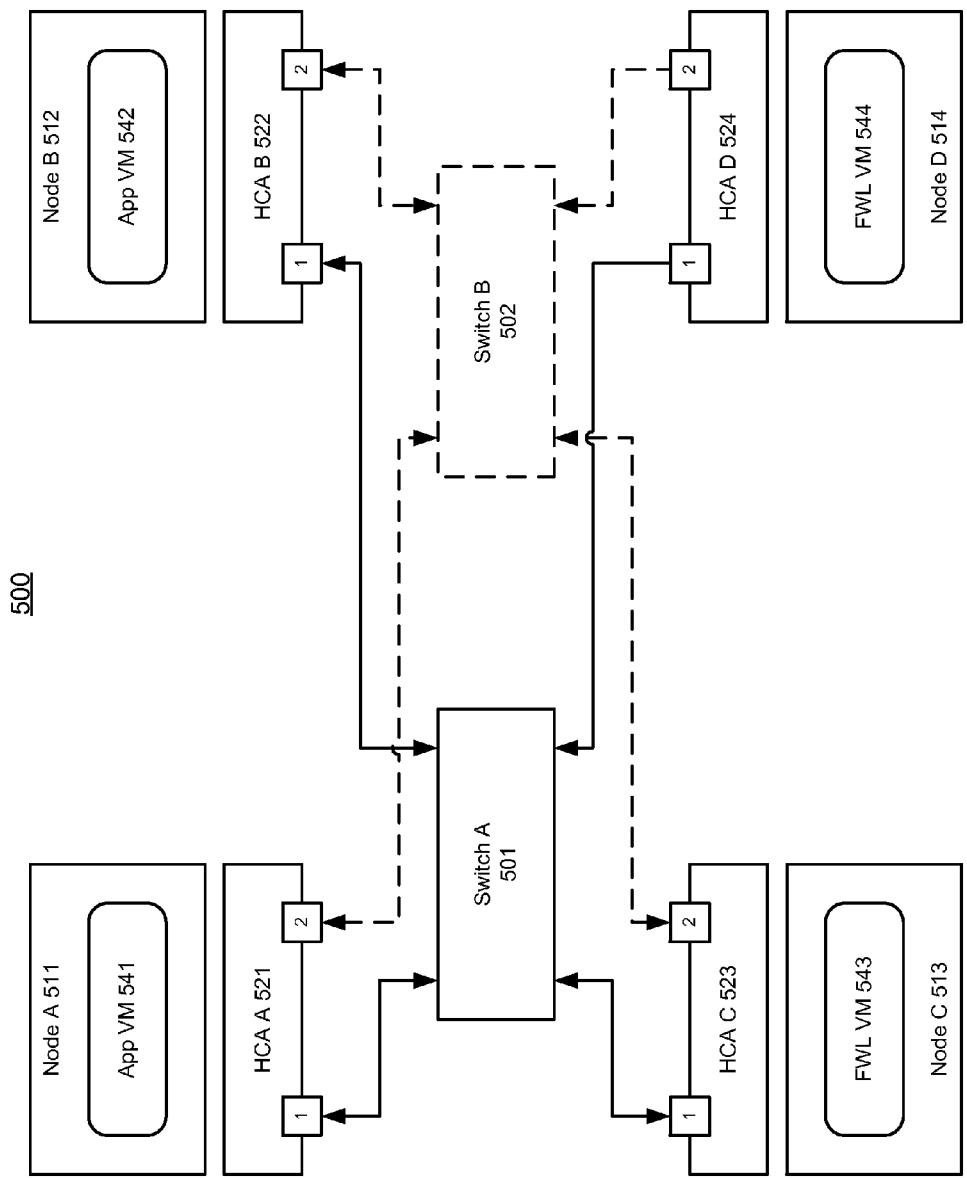
FIG. 5 shows an illustration of an exemplary engineered system, in accordance with an embodiment of the invention.

FIG. 5 shows an illustration of an exemplary engineered system, in accordance with an embodiment of the invention. As shown in FIG. 5, an exemplary engineered system 500 can include a plurality of nodes, such as nodes A-D 511-514, which are interconnected using multiple switches A-B 501-502.

In accordance with an embodiment of the invention, the data service components, such as the firewall (FWL) appliances, can be deployed in pairs for supporting high availability (HA) and improving performance in the engineered system 500.

As shown in FIG. 5, an application VM 541, which contains an application server, can be deployed on the node A 511, and an application VM 542, which contains another application server, can be deployed on the node B 512. Additionally, a FWL VM 543, which contains a FWL appliance, can be deployed on the node C 513, and a FWL VM 544, which contains another FWL appliance, can be deployed on the node D 514.

Furthermore, each of the nodes A-D 511-514 can use one or more host channel adaptors (HCAs) for connecting to the network. For example, the node A 511 uses the HCA A 521, the node B 512 uses the HCA B 522, the node C 513 uses the HCA C 523, and the node D 514 uses the HCA D 524.

As shown in FIG. 5, each of the HCA A-D 521-524 can have two ports (e.g. a port 1 and a port 2). In order to support high availability (HA) in the network environment 500, the system can connect the different HCA ports for the nodes A-D 511-514 via different switches A-B 501-502.

In accordance with an embodiment of the invention, different HCA ports on the same node can be independently assigned to the different members in each FWL HA pair. For example, the subnet administrator (SA) in an IB subnet can be aware of the HA pairs, when assigning the FWL destination local identifiers (DLIDs).

As shown in FIG. 5, all of the ports 1 on the nodes A-D 511-514 can be connected to the switch A 501, while all of the ports 2 on the nodes A-D 511-514 can be connected to the switch B 502. Thus, when a failure occurs on one of the switches, e.g. on the switch A 501, the traffic in the engineered system 500 (among the nodes A-D 511-514) can still be transmitted through the switch B 502 and the firewall (FWL) appliances on node D 514 can be used for inspecting the traffic. (Additionally, such a scheme can be generalized to the case of multiple HCAs per node without limitation.)

Figure 6:
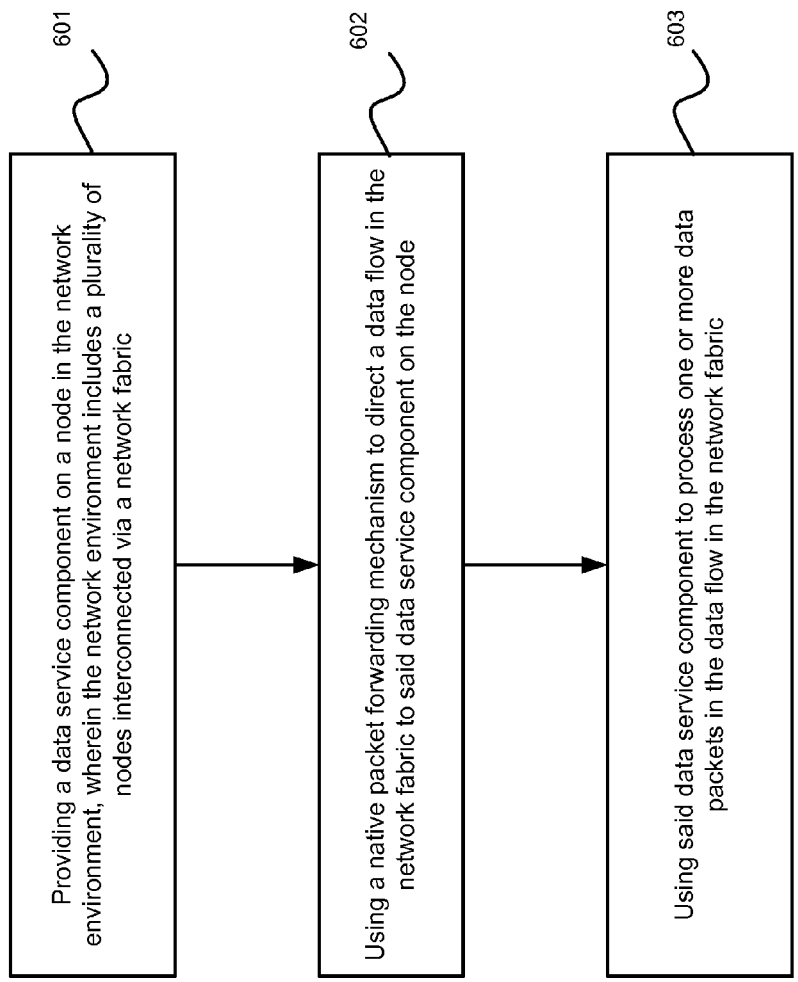
FIG. 6 illustrates an exemplary flow chart for providing a data service for handling native data in a network environment, in accordance with an embodiment of the invention.

FIG. 6 illustrates an exemplary flow chart for providing a data service for handling native data in a network environment, in accordance with an embodiment of the invention. As shown in FIG. 6, at step 601, the system can provide a data service component on a node in the network environment, wherein the network environment includes a plurality of nodes interconnected via a network fabric. Then, at step 602, the system can use a native packet forwarding mechanism to direct a data flow in the network fabric to said data service component on the node. Furthermore, at step 603, the system can use said data service component to process one or more data packets in the data flow in the network fabric.

Controlling the Data Flow

Figure 7:
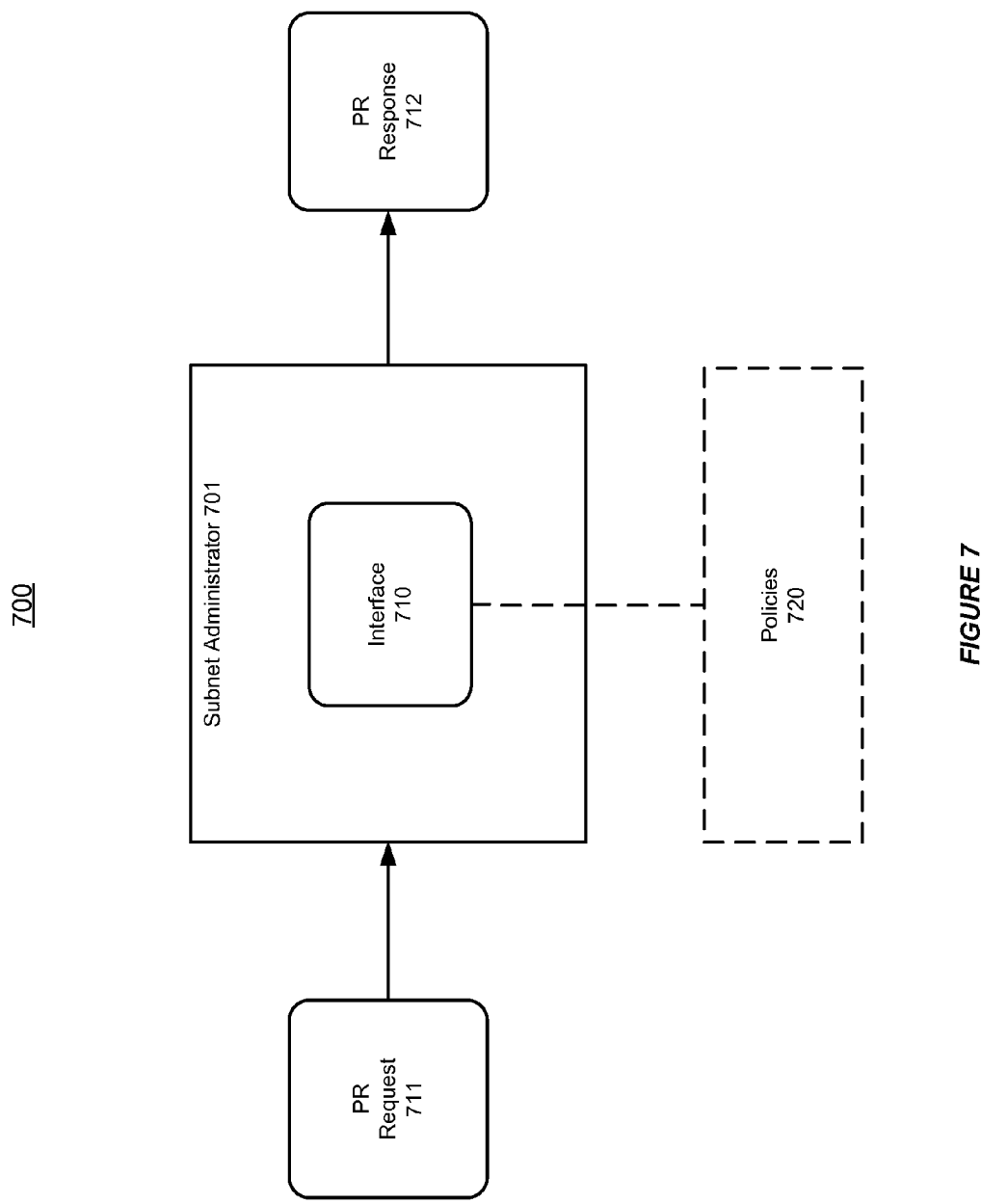
FIG. 7 shows an illustration of a subnet administrator (SA) in a network environment, in accordance with an embodiment of the invention.

FIG. 7 shows an illustration of a subnet administrator (SA) in a network environment, in accordance with an embodiment of the invention. As shown in FIG. 7, an IB fabric 700 can include a subnet administrator (SA) 701, which can provide path record resolution (PR) for supporting communication between various nodes in the IB fabric 700. For example, a path record, such as a pathrecord in the IB protocol, can include the address information and other information that relates to different fields in the IB headers (such as the P_Key, Q_Key, SL, etc.).

Additionally, the system can provide an interface 710 for configuring the SA 701 with different policies 720. The interface 710 can be a command line interface (CLI) and/or an application programming interface (API).

In accordance with an embodiment of the invention, the policies 720 can define what traffic should pass through a data service node (e.g. a firewall) before reaching the destination node, and what traffic can be forwarded directly to the destination node. Furthermore, the policies can be implemented based on the source and destination global identifiers (GIDs). Also, the policies can be implemented based on a service ID, which provides the application-level differentiation. Additionally, the policies can be implemented based on IB partitions.

For example, a use case may support a policy that requires all communication between a middleware machine and a cluster database machine must go through a firewall node.

Additionally, a uses case may support a policy that requires the use of a specific IB partition, which is associated with a particular P_Key. For example, the specific IB partition can be used solely for the firewall controlled communication between all application tier servers and a database. If a path record resolution request is within the context of the specific IB partition, the SA 701 can use this policy to indicate that all packets on that path should be routed through the firewall.

Another use case may support a policy for the BoW deployment that involves two independent subnets. The SM may not be able to discover a path between the source and destination in two independent subnets, by simply examining the fabric topology. Using the policy, the SM can be informed that a path between the source and the destination exists through a particular data service component. Also, when the BoW deployment involves multiple IB partitions, the P_Key for each partition can be specified in the policy.

As shown in FIG. 7, the SA 701 can receive a PR request 711 from a requester (e.g. a source node). The SA 701 can resolve the destination local address, e.g. a destination local identifier (DLID), according to the policies 720. Then, the SA 701 can send a PR response 712, which includes the resolved destination local address, back to the requester.

Thus, the source node can send a data packet to the destination node based on the resolved DLID.

Alternatively, the SA 701 may determine that the source node should direct the data packet to an intermediate node, such as a data service node with a data service component (e.g. a software firewall) before forwarding the data packet to the destination node. The SA 701 can provide the source node with a DLID for the data service node instead of a DLID for the destination node. Additionally, the SA 701 can determine which data service node should be used when multiple instances of the data service component exist in the network environment 700.

Figure 8:
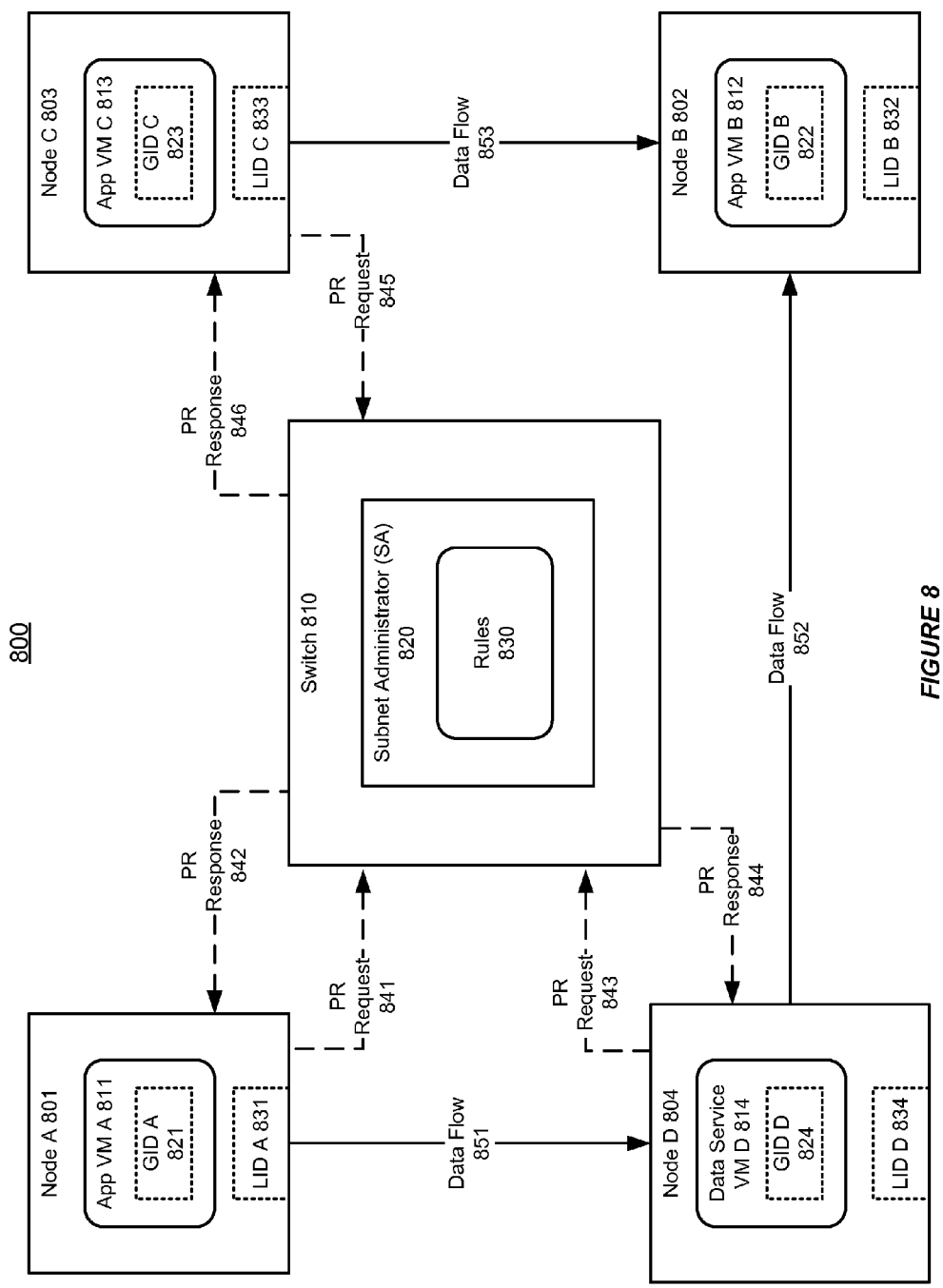
FIG. 8 shows an illustration of supporting a control flow for providing a data service in a network environment, in accordance with an embodiment of the invention.

FIG. 8 shows an illustration of supporting a control flow for providing a data service in a network environment, in accordance with an embodiment of the invention. As shown in FIG. 8, a network environment 800 can include a plurality of nodes, e.g. nodes A-D 801-804, which are interconnected using one or more switches, e.g. a switch 810.

The switch 810 can be used to direct the data flow in the network environment 800. The switch 810 can include a subnet administrator (SA) 820, which can perform the path record resolution operation based on different rules or policies, e.g. rules 830. The SA 820, which runs in a secure environment on a switch 810 (or on a secure node), can implement various logics for performing address resolution tasks.

In accordance with an embodiment of the invention, based on the SA policies, the system can take advantage of the global routing header (GRH) in the IB packet for establishing communication through different paths that can be either within an IB subnet or among multiple IB subnets. (The GRH was originally defined in the IB specification for establishing communication among different IB subnets)

For example, the SA 820 can use a field in a path record resolution response (e.g. the HopLimit field) to indicate to the host software stack that a GRH may be required for establishing communication through a specific path within an IB subnet.

As shown in FIG. 8, the node A 801 can host an application VM A 811 that contains an application server. The application VM A 811 can be associated with a global identifier (GID) A 821 (e.g. 0xAAAA) and a local port with a local identifier (LID) A 831 (e.g. 0xA). Furthermore, the node B 802 can host an application VM B 812 that contains an application server. The application VM B 812 can be associated with a GID B 822 (e.g. 0xBBBB) and a local port with a LID B 832 (e.g. 0xB). Also, the node C 803 can host an application VM C 813 that contains an application server. The application VM C 813 can be associated with a GID C 823 (e.g. 0xCCCC) and a local port with a LID C 833 (e.g. 0xC).

Additionally, the network environment 800 can include a data service node D 804, which can host a data service VM D 814. The data service VM 814 can be associated with a GID D 824 (e.g. 0xDDDD) and a local port with a local identifier D 834 (e.g. 0xD). Additionally, the data service node D 804 can host one or more application VMs in addition to the data service VM 814.

As shown in FIG. 8, within an IB fabric in the network environment 800, the data flow, which includes the transmitted data packets (as shown in solid line), can be based on the standard LID-based forwarding feature as provided by the switch 810. Additionally, the control flow, which includes various control information (as shown in dashed line), can be based on the address resolution feature as provided by the SA 820.

For example, a set of exemplary rules 830 can be defined in the following table.

0xAAAA-0xBBBB→0xD
0xCCCC-0xBBBB→0xB
0xDDDD (0xAAAA)-0xBBBB→0xB

As shown in the above table, the first rule defines that all packets, which are originated from the VM with GID 0xAAAA and are targeting the VM with GID 0xBBBB, should be transmitted with the DLID 0xD. The second rule defines that all packets, which are originated from the VM with GID 0xCCCC and are targeting the VM with GID 0xBBBB, should be transmitted with the DLID 0xB. The third rule defines that all packets, which are sent from the VM with GID 0xDDDD (originated from 0xAAAA) and are targeting the VM with GID 0xBBBB, should be transmitted with the DLID 0xB.

As shown in FIG. 8, the node A 801 can initiate a data flow to the node B 802, by sending a PR request 841 to the SA 820 on the switch 810. After the subnet administrator 820 receives the PR request 841 from the node A 801, the SA 820 can process the PR request 841 according to the first rule in the above table, and send a PR response 842 to the node A 801. The PR response 842 can indicate that the data packet needs to be directed to the data service node D 804, which has a local port that can be identified using the LID 0xD.

Then, the source node A 801 can direct the data flow 851 to the data service node D 804. After the data service node D 804 has processed the received data flow 851, the data service node D 804 can send a PR request 843 to the SA 820. The SA 820 can, in turn, return a PR response 844 that contains the real address of the node B 802. Thus, the data service node D 804 can direct the data flow 852 to the destination node B 802. Alternatively, the data service node D 804 may decide to drop the received packets.

Also as shown in FIG. 8, the SA 820 can direct the data flow 853 directly from the node C 803 to the node B 802 bypassing the data service node D 804. In this example, the node C 803 can first send a PR request 845 to the SA 820. Then, the SA 820 can return the real address of the node B 802 in a PR response 846.

In accordance with an embodiment of the invention, the data service node D 804 can use other mechanisms to obtain a mapping of the destination GID to the destination LID without limitation. For example, both the data flow and the control flow can be based on the LID forwarding feature or both the data flow and the control flow can be based on the addressing scheme as enforced by the subnet administrator (SA) 820.

Furthermore, when a VM is the member of multiple IB partitions, different forwarding rules can be defined for the different IB partitions (e.g. based on the different P_Keys). Thus, the traffic on some IB partitions can be directly routed to the destination, while traffic on other IB partitions may need to be routed to the data service appliance.

Figure 9:
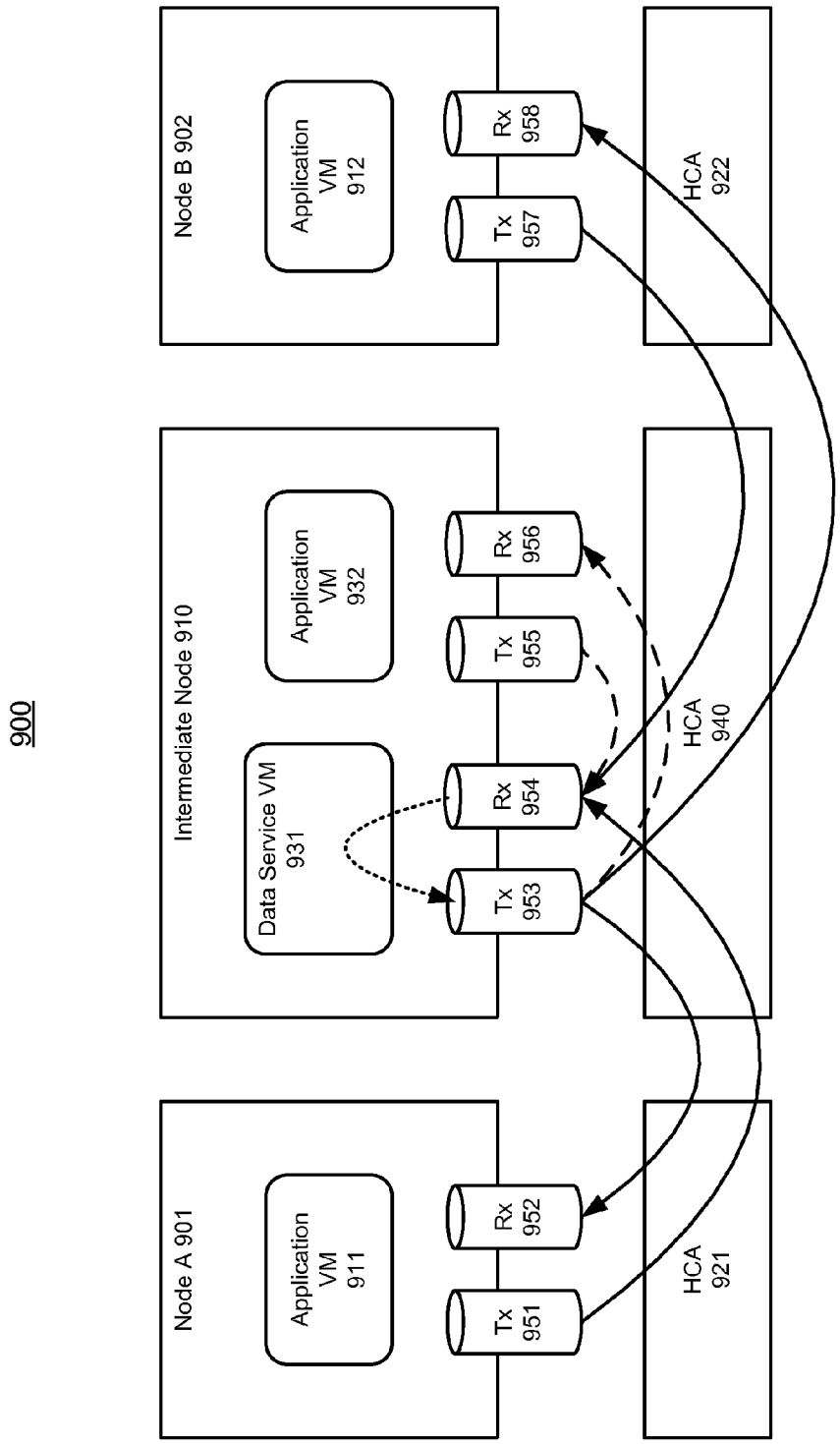
FIG. 9 shows an illustration of supporting a data flow for providing a data service in a network environment, in accordance with an embodiment of the invention.

FIG. 9 shows an illustration of supporting a data flow for providing a data service in a network environment, in accordance with an embodiment of the invention. As shown in FIG. 9, nodes A-B 901-902 in a network environment 900 can communicate with each other via an intermediate node 910.

The node A 901, which is associated with a host channel adaptor (HCA) 921, includes an application virtual machine (VM) 911 that hosts an application server. Furthermore, the node B 902, which is associated with a host channel adaptor (HCA) 922, includes an application VM 912 that hosts another application server.

Additionally, the intermediate node 910, which is associated with a host channel adaptor (HCA) 940, can include a data service VM 931 and an application VM 932 (i.e. the data service VM 931 and the application VM 932 shares the same physical machine). The data service VM 931 can host a data service component and the application VM 932 can host an application server.

In order to prevent the direct communication between the node A 901 and the node B 902, the system can configure both the node A 901 and the node B 902 as limited members of a partition in an IB fabric, while allowing the intermediate node 910 to be a full member of the partition.

As shown in FIG. 9, the data flow from the node A 901 can be initiated by the application VM 911 using the transmitting (Tx) queue pairs (QPs) 951. Furthermore, based on a PR response received from the SA, the node A 901 can send data packets to the receiving (Rx) queue pairs (QPs) 954 on the intermediate node 910. Thus, the data service VM 931 on the intermediate node 910 can receive the data packets from the node A 901 via the Rx QPs 954.

Then, the data service component in the data service VM 931 can process the incoming data flow. For example, the data service VM 931 can provide firewall service by examining the incoming data flow and can drop questionable data packets. Additionally, the data service VM 931 can provide other data services, such as sniffing, performance monitoring, and load balancing.

After completing the data processing, the data service VM 931 can transmit the outgoing data packets from the Tx QPs 953 to the Rx QPs 958 on the node B 902 (e.g. based on the standard LID-based switching). Thus, the application VM 912 can receive the data packets in the data flow.

Furthermore, the application VM 912 on the node B 902 can send a return packet back to the application VM 911 on the node A 901, via the intermediate node 910. As shown in FIG. 9, the return data flow can start from the Tx QPs 957 on the node B 902 and ends at the Rx QPs 952 on the node A 901, via the Rx QPs 954 and Tx QPs 953 on the intermediate node 910. Thus, the application VM 911 on node A 901 can receive the return packets from the node B 902.

Additionally, the application VM 932, which is located on the intermediate node 910, can send one or more data packets to other nodes (e.g. via the Tx QPs 955), through the data service VM 931. Also, the application VM 932 can receive one or more data packets from other nodes (e.g. via the Rx QPs 956). Furthermore, depending on the policy configuration, the application VM 932 can send one or more data packets to other nodes and/or receive one or more data packets from other nodes directly, bypassing the data service 931.

In accordance with an embodiment of the invention, the processing of the data flow at the data service VM 931 on the intermediate node 910 can be transparent to both the source node A 901 and the destination node B 902 (i.e. node A 901 may actually 'think' that it transmits data to the node B 902 directly).

Furthermore, the data service component (e.g. a software firewall) in the data service VM 931 can be a distributed virtualized software appliance. Other nodes in the network environment 900 may not be aware of the existence of the intermediate node 910 and the data service appliance in the data service VM 931.

Figure 10:
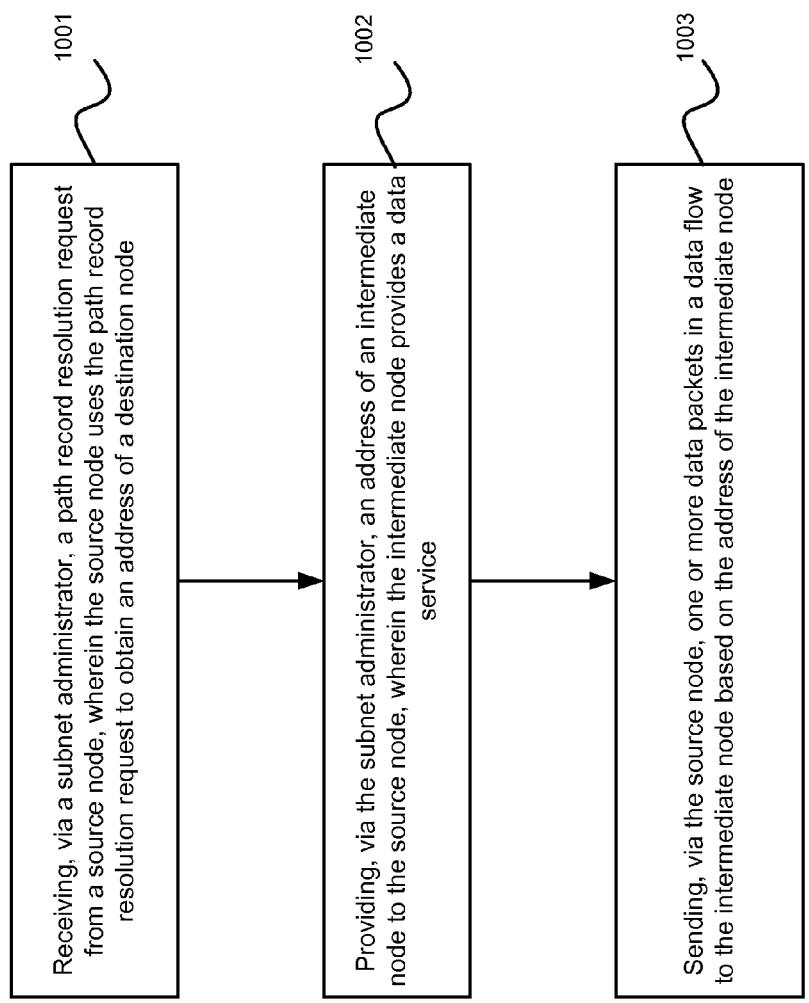
FIG. 10 illustrates an exemplary flow chart for controlling the data flow for handling native data in a network environment, in accordance with an embodiment of the invention.

FIG. 10 illustrates an exemplary flow chart for controlling the data flow for handling native data in a network environment, in accordance with an embodiment of the invention. As shown in FIG. 10, at step 1001, a subnet administrator (SA) can receive a path record resolution request from a source node, wherein the source node uses the path record resolution request to obtain an address of a destination node. Then, at step 1002, the SA can provide an address of an intermediate node to the source node, wherein the intermediate node provides a data service. Furthermore, at step 1003, the source node can send one or more data packets to the intermediate node based on the address of the intermediate node.

Data Service Addressing

Figure 11:
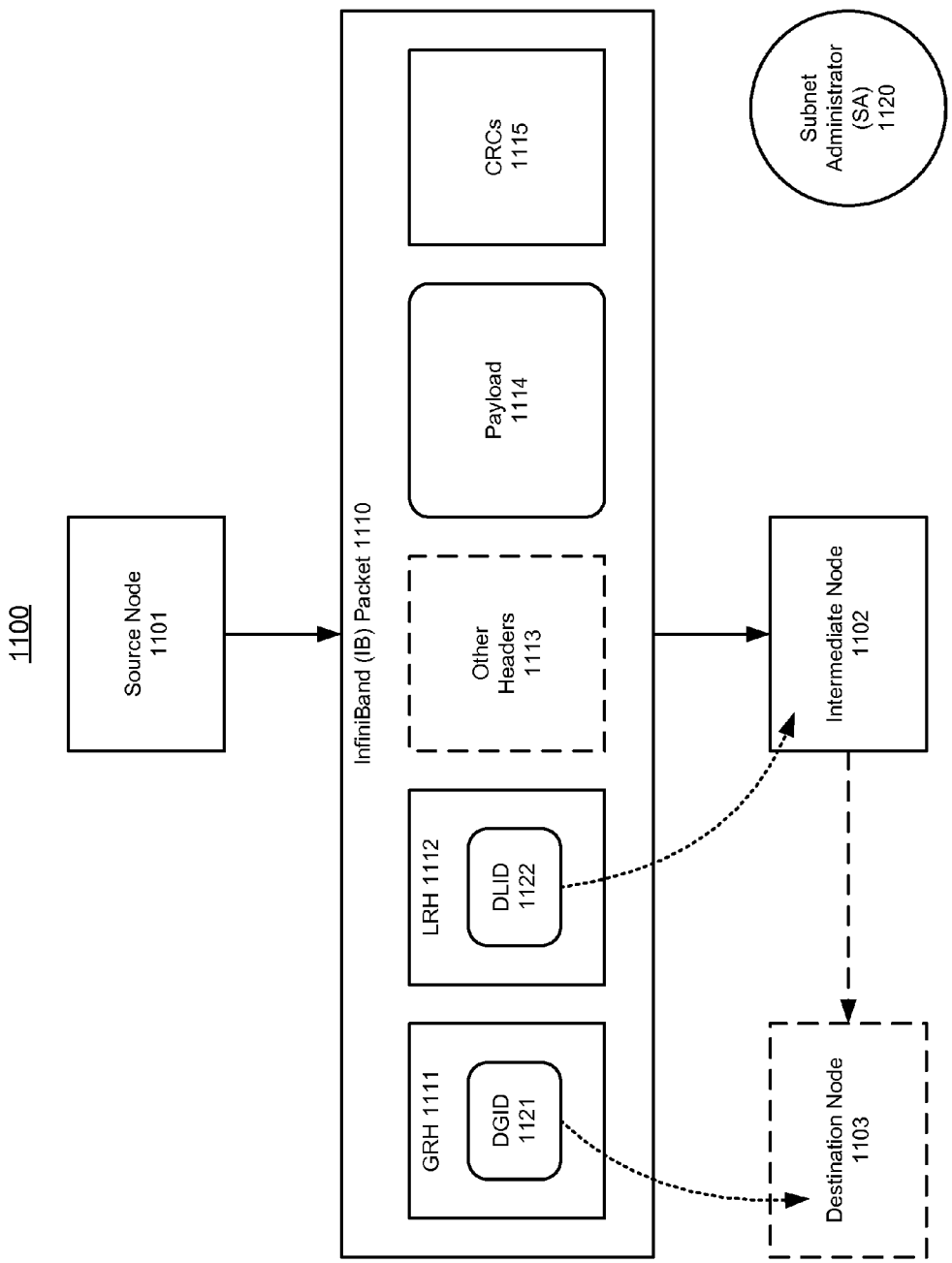
FIG. 11 shows an illustration of a data packet format using InfiniBand (IB) addressing to access a data service in a network environment, in accordance with an embodiment of the invention.

FIG. 11 shows an illustration of a data packet format using InfiniBand (IB) addressing to access a data service in a network environment, in accordance with an embodiment of the invention. As shown in FIG. 11, an IB subnet 1100 can include a plurality of physical (or virtual) nodes 1101-1103 and a subnet administrator (SA) 1120. A source node 1101 can send a packet (e.g. an IB packet 1110) to a destination node 1103, via an intermediate node 1102.

The IB packet 1110 can include the payload 1114 and various headers according to the IB protocols. These headers can include a global routing header (GRH) 1111, a local routing header (LRH) 1112, and other headers 1113. Additionally, the IB packet 1110 can be applied with various cyclic redundancy checks (CRCs) 1115.

In accordance with an embodiment of the invention, the system can take advantage of the destination global identifier (DGID) 1121 in the GRH 1111 and the destination local identifier (DLID) 1122 in the LRH 1112 for supporting data service addressing in the IB subnet 1100.

For example, the system can set the DLID 1122 in the IB packet 1110 to be the DLID for the intermediate node 1102 (instead of the DLID for the destination node 1103). Within the IB subnet 1100, the IB packet 1110 can be routed to the intermediate node 1102 based on the DLID 1122 as resolved by the SA 1120. Thus, the IB packet 1110 can be processed using a data service provided on the intermediate node 1102.

Furthermore, the system can use the DGID 1121 in the GRH 1111 to indicate the DLID for the destination node 1103. Thus, the data service software in the intermediate node 1102 is able to resolve (or obtain) the real DLID for the destination node 1103 based on the DGID 1121 information in the GRH 1111.

In accordance with an embodiment of the invention, the intermediate node 1102 can perform additional packet header 1113 and/or payload 1114 modifications when necessary. For example, the fabric level access control can be set up in a way that the source node 1101 and the destination node 1103 are either limited members of a relevant partition or not members of the same partition. In such a case, the intermediate node 1102 may need to change the P_Key value in the IB packet 1110 before forwarding the modified packet to the destination node 1103.

Figure 12:
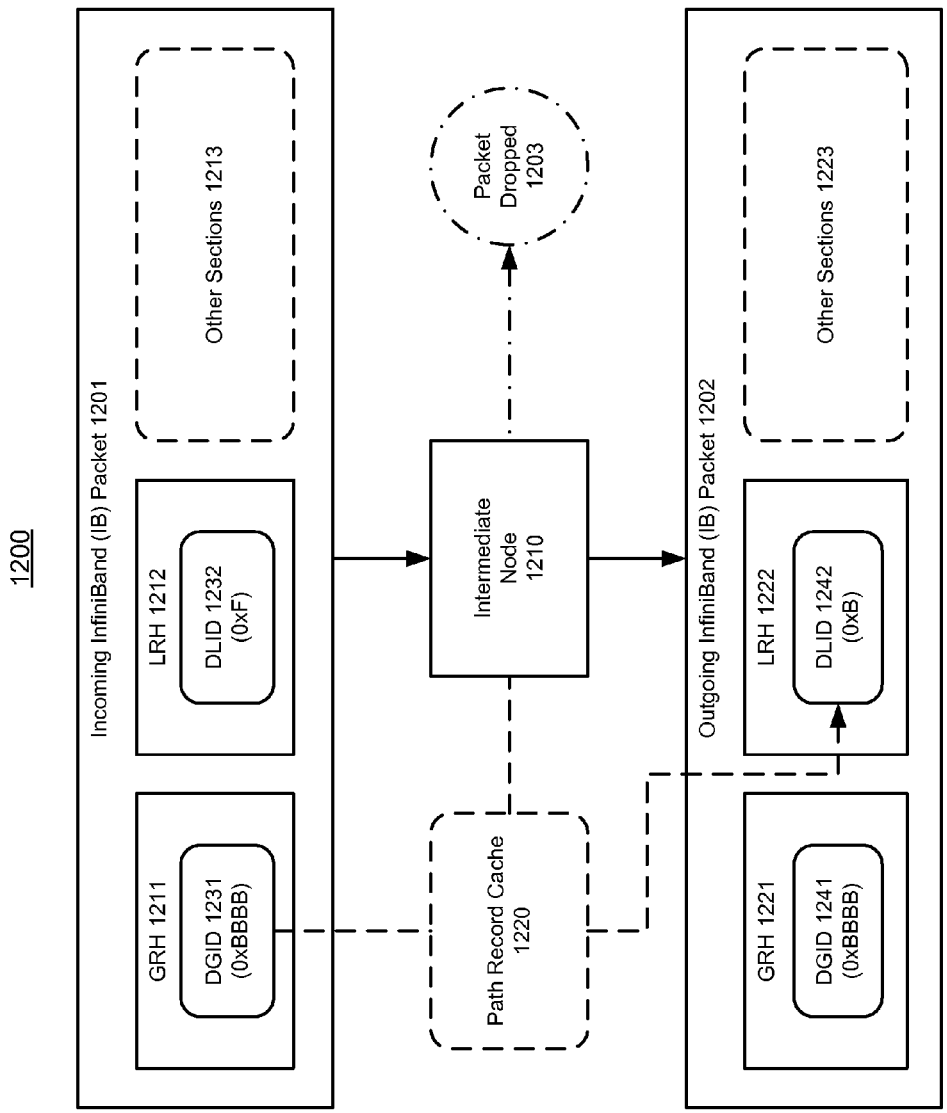
FIG. 12 shows an illustration of handling a data packet on an intermediate node in a network environment, in accordance with an embodiment of the invention.

FIG. 12 shows an illustration of handling a data packet on an intermediate node in a network environment, in accordance with an embodiment of the invention. As shown in FIG. 12, an intermediate node 1210 in an IB subnet 1200 can receive one or more data packets (e.g. an incoming IB packet 1201) from a source node.

The incoming IB packet 1201 may include a global routing header (GRH) 1211 and a local routing header (LRH) 1212, in addition to the other sections 1213. For example, the GRH 1211 can contain a destination global identifier (DGID) 1231, e.g. 0xBBBB, for a destination node, and the LRH 1212 can contain a destination local identifier (DLID) 1232, e.g. 0xF, for the intermediate node 1210.

Furthermore, the intermediate node 1210 can provide a data service, such as a firewall service that can inspect the incoming IB packet 1201. After processing the incoming IB packet 1201 using the data service, the intermediate node 1210 can send an outgoing IB packet 1202 to the destination node (as indicated in the DGID 1231 in the incoming IB packet 1201). Alternatively, the intermediate node 1210 may decide to drop the packet 1203.

As shown in FIG. 12, the outgoing IB packet 1202 can include a GRH 1221 and a LRH 1222, in addition to the other sections 1223. The GRH 1221 can contain a DGID 1241 for the destination node and the LRH 1222 can contain a DLID 1242 for the destination node.

In accordance with an embodiment of the invention, a path record cache 1220 can be used to resolve the real DLID for the destination node, which can be used to direct the outgoing IB packet 1202 to the destination node within the subnet 1200.

The path record cache 1220 can exist on various nodes in the IB subnet 1200, and an SA can coordinate the behavior of the path record cache 1220. Thus, the SA is capable of returning the data service address on the intermediate node 1210 or the destination application address on a destination node for the different requests.

Additionally, the path record cache 1220 can take advantage of an address mapping table. The following is an exemplary address mapping table.

DGID=0xBBBB→DLID=0xB
DGID=0xCCCC→DLID=0xC
DGID=0xAAAA→DLID=0xA

As shown in FIG. 12, the DGID 1231 in the GRH 1211 can be used by the data service software for resolving the real destination DLID 1242 based on the path record cache 1220. For example, the incoming packet 1201 can include the header information of 'DGID=0xBBBB' and 'DLID=0xF.' Applying the first rule in the above address mapping table, the intermediate node 1210 can update the outgoing packet to include the header information of 'DGID=0xBBBB' and 'DLID=0xB.'

Furthermore, the intermediate node 1210 may need to manipulate a P_Key value, which is a field of the basic transport header (BTH) in a received packet 1201, since both end nodes may be configured as limited members of a corresponding partition. For example, a packet transmitted by a source node may have a limited P_Key (which is configured as most significant bit (MSB) clear). The intermediate node 1210 may need to modify this limited P_Key to a full P_Key (which is configured as most significant bit (MSB) set), before transmitting the packet to the destination node.

Additionally, the intermediate node 1210 can provide a mapping for other transport level address information, such as the QP numbers, the Q_Key values etc. For example, the intermediate node 1210 can use a local QP number for receiving one or more data packets from the sender nodes (which can be identified by the source QP number and the source node). Furthermore, the intermediate node 1210 can modify the received packets to ensure that both the source node and the destination node can identify the transport level address information as defined by a data service on the intermediate node 1210 (rather than as defined by a remote end-node).

Thus, the intermediate node 1210 can control what transport level resources are exposed between the end nodes. Also, the intermediate node 1210 can make use of the local QPs that are implemented by the local hardware, in order to optimize performance and provide different qualify of service (QoS) on various data flows between different pairs of end nodes.

Figure 13:
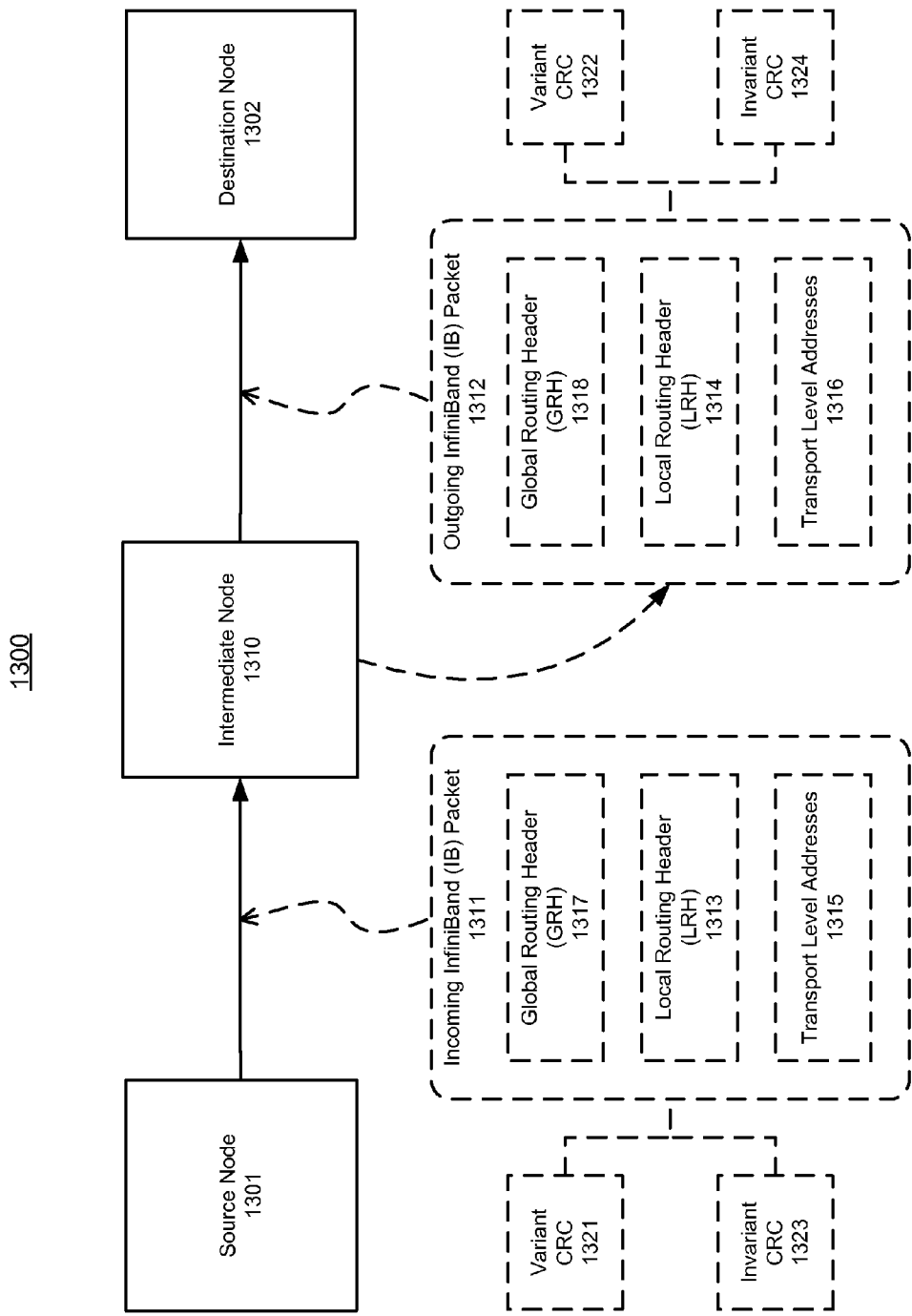
FIG. 13 shows an illustration of supporting connection management in a network environment, in accordance with an embodiment of the invention.

FIG. 13 shows an illustration of supporting connection management in a network environment, in accordance with an embodiment of the invention. As shown in FIG. 13, a source node 1301 and a destination node 1302 in an IB subnet 1300 can communicate with each other via an intermediate node 1310.

For example, an IB packet 1311 can be forwarded from the source node 1301 to the intermediate node 1310. The incoming IB packet 1311 can include a global routing header (GRH) 1317, a local routing header (LRH) 1313 and other transport level address information 1315. Additionally, the IB packet 1311 can be applied with a variant cyclic redundancy check (CRC) 1321 and an invariant cyclic redundancy check (CRC) 1323.

Furthermore, the intermediate node 1310 can provide a data service. Then, after processing the incoming IB packet 1311 using the data service, the intermediate node 1310 can forward an outgoing IB packet 1312 to the destination node 1302. The IB packet 1312 can include a global routing header (GRH) 1318, a local routing header (LRH) 1314 and other transport level address information 1316. Additionally, the IB packet 1312 can be applied with a variant cyclic redundancy check (CRC) 1322 and an invariant cyclic redundancy check (CRC) 1324.

In accordance with an embodiment of the invention, the isolation of the source node 1301 and the destination node 1302 can be implemented using the partitioning and/or other IB fabric level access control technologies.

The intermediate node 1310 is able to observe all traffic between the source node 1301 and the destination node 1302. The intermediate node 1310 can identify all communication management operations, such as the management datagrams (MADs) exchanged between the source node 1301 and the destination node 1302. Also, the intermediate node 1310 can identify various broadcast/multicast based address resolution operations, such as the address resolution protocol (ARP) operations.

In accordance with an embodiment of the invention, depending on the packet types, the intermediate node 1310 can process the received IB packet 1311 differently based on the observed communication.

For example, the outgoing packet 1312 can resemble the incoming IB packet 1311 with only LRH 1314 modified. In such a case, the system may only need to re-compute the packet variant CRC 1322. On the other hand, the invariant CRC 1324 for the outgoing packet 1312 can remain the same as the invariant CRC 1322 in the incoming IB packet 1311. Thus, the invariant CRC 1322, which is generated by the original sender (e.g. the source node 1301), can protect the data packet all the way to the final receiver (e.g. the destination node 1302). The intermediate node 1310 can ensure the end-to-end packet integrity in a way that is similar to a switch.

Alternatively, the intermediate node 1310 may modify other header information such as the transport level address information 1315 in the IB packet 1311, and may potentially modify the IB packet payload in the IB packet 1311.

For example, the intermediate node 1310 may need to generate a new invariant CRC 1324, when P_Key or any other transport header information 1315 is modified. In such a case, the system can have completely independent packet integrity protection schemes, which may no longer provide the end-to-end protection between the source node 1301 and the destination node 1302 within the IB subnet 1300.

Also, the intermediate node 1310 can perform an incremental invariant CRC update to take into account a P_Key, the value of which is modified directly in the packet or is modified via control interface (such as Work Request). Thus, the intermediate node 1310 can preserve data integrity characteristics of the IB payload and the HCA 1510 allows the modification of the IB P_Key for supporting isolation between two end points.

In accordance with an embodiment of the invention, the system can employ a separate bit error protection scheme for protecting involved buffers and data path, in order to minimize the risk of bit errors that may be introduced by the generation of the new invariant CRCs 1324 at the intermediate node 1310. Also, the system can take advantage of various end-to-end protocols, which are based on additional checksums, in order to protect the end-to-end data integrity.

Figure 14:
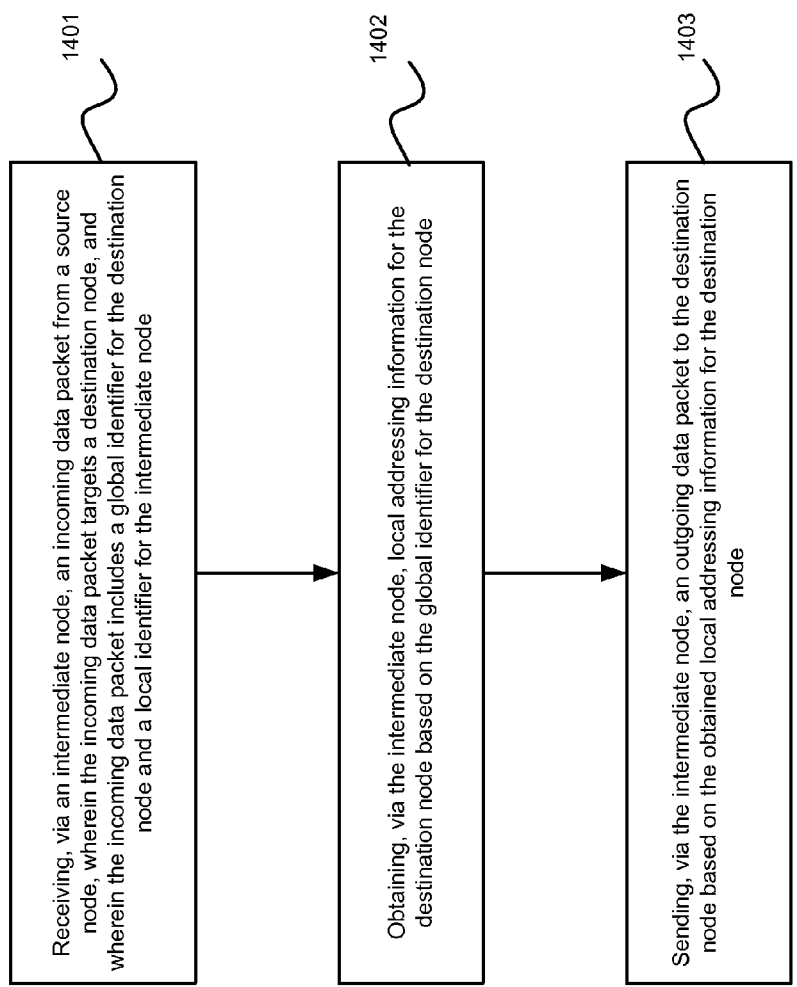
FIG. 14 illustrates an exemplary flow chart for supporting data service address resolution for handling native data in a network environment, in accordance with an embodiment of the invention.

FIG. 14 illustrates an exemplary flow chart for supporting data service address resolution for handling native data in a network environment, in accordance with an embodiment of the invention. As shown in FIG. 14, at step 1401, an intermediate node can receive an incoming data packet from a source node, wherein the incoming data packet targets a destination node, and wherein the incoming data packet includes a global identifier for the destination node and a local identifier for the intermediate node. Then, at step 1402, the intermediate node can obtain local addressing information for the destination node based on the global identifier for the destination node. Furthermore, at step 1403, the intermediate node can send an outgoing data packet to the destination node based on the obtained local addressing information for the destination node.

Host Channel Adaptor (HCA) Filtering

Figure 15:
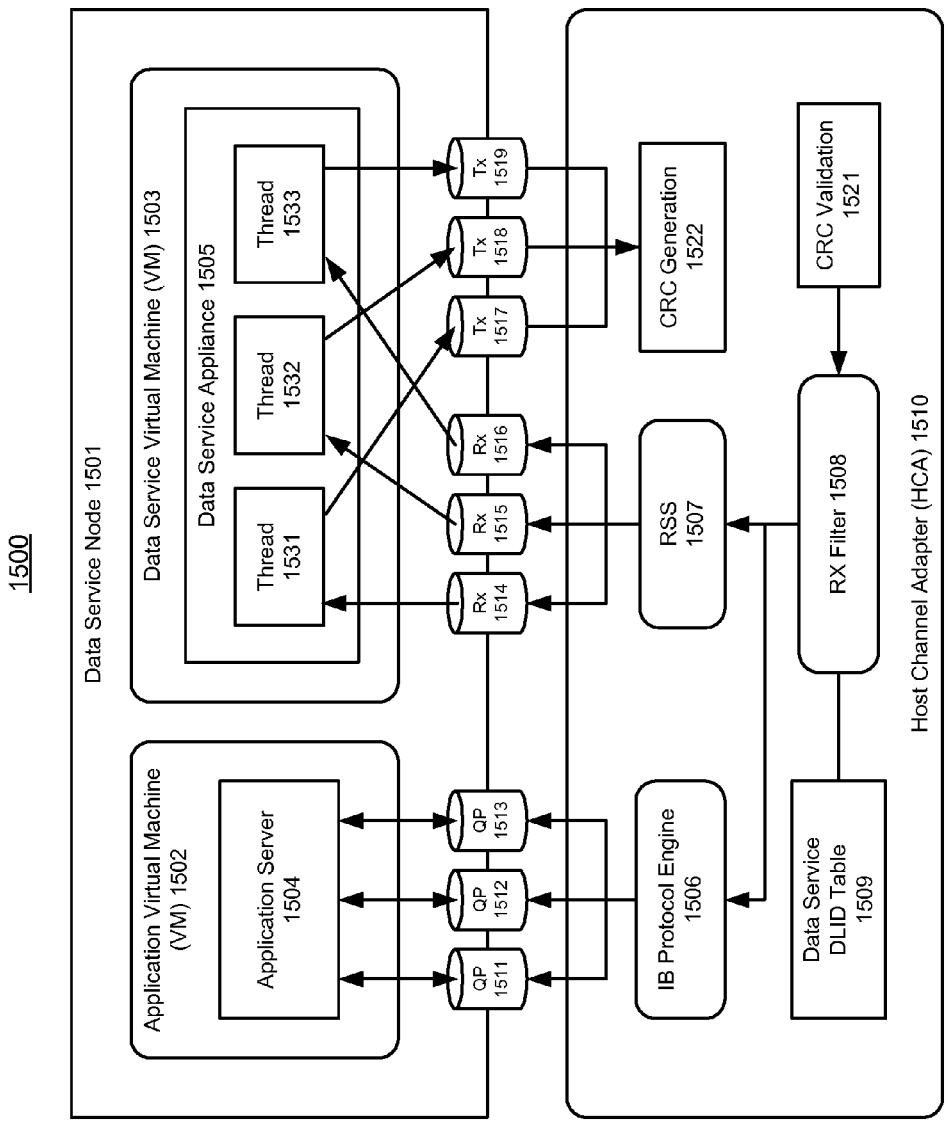
FIG. 15 shows an illustration of supporting host channel adaptor (HCA) filtering for providing data services in a virtualized environment, in accordance with an embodiment of the invention.

FIG. 15 shows an illustration of supporting host channel adaptor (HCA) filtering for providing data services in a virtualized environment, in accordance with an embodiment of the invention. As shown in FIG. 15, a data service node 1501 in a network environment 1500 can use a network connecting device, such as a host channel adaptor (HCA) 1510, for network connections.

The data service node 1501 can include an application VM 1502, which includes an application server 1504, and a data service VM 1503, which includes a data service component (e.g. a data service appliance 1505). Furthermore, the data service node 1501 can receive a mixed data flow. The mixed data flow traffic may target either the application VM 1502 or the data service VM 1503.

As shown in FIG. 15, the data service node 1501 can be associated with the queue pairs (QPs) 1511-1519. The application VM 1502 can be associated with the queue pairs (QPs) 1511-1513, and the data service VM 1503 can be associated with the receiving (Rx) queue pairs (QPs) 1514-1516 and the transmitting (Tx) QPs 1517-1519.

In accordance with an embodiment of the invention, the data service node 1501 can use the HCA 1510 for providing filter capabilities. Also, the HCA 1510 can provide various interfaces for programming the filters.

For example, the HCA 1510 can use the LID-based filtering for supporting the virtual appliance, in which case the HCA Ports for the standard protocol termination part can be configured with a standard LID/LMC and the HCA ports for the firewall can be assigned with one or more different LIDs. Alternatively, the HCA 1510 can apply the inverse logic, i.e. any incoming IB packet that does not fall under the standard LID range may be directed to the firewall.

As shown in FIG. 15, HCA 1510 can include a receiving (Rx) filter 1508, which can identify packets targeting the data service appliance 1505 without protocol termination. Thus, the HCA 1510 can separate the data flow traffic targeting the data service component 1505 from the data flow traffic targeting the application server 1504.

For example, the Rx filter 1508 can separate the mixed data flow traffic based on the data service DLID (e.g. using DLID based filtering). The Rx filter 1508 can be associated with a data service DLID table 1509. The following is an exemplary data service DLID table.

DLID=0xF
DLID=0xFF

When an incoming packet has a matching DLID, (e.g. 0xF or 0xFF), the Rx filter 1508 can direct the packet to the data service component 1505 on the data service VM 1503, via QPs 1514-1516. The HCA 1510 can treat these packets as raw packets, and can forward these incoming packets as they have been received (i.e. including all IB headers).

On the other hand, if an incoming packet does not have a matching DLID (i.e. with a DLID other than 0xF and 0xFF), the Rx filter 1508 can direct the incoming packet to the application server 1504 on the application VM 1502, which can use an IB protocol engine 1506 to handle the IB packet according to the IB protocol.

Alternatively, the Rx filter 1508 can use the DGID information in the GRH in an incoming packet for determining where to forward the packet. When an incoming packet has a matching DGID, the Rx filter 1508 can direct the packet to the data service component 1505 on the data service VM 1503. If the incoming packet does not have a matching DGID, the Rx filter 1508 can direct the packet to the application server 1504 on the application VM 1502, which can use an IB protocol engine 15015 to handle the IB packet according to the IB protocol.

Additionally, the Rx filter 1508 can be based on invert filtering (or reverse filtering). For example, the invert filtering can be beneficial in the bump-on-the-wire (BOW) use case (i.e. when the data service node 1501 separates two communicating nodes).

In such a case, the HCA 1510 can use its standard port LID configuration to identify the packets that target the application VM 1502. The HCA 1510 can process these packets according to the IB standard definition. Furthermore, the HCA 1510 can treat all other packets as targeting the data service component 1505.

In accordance with an embodiment of the invention, the HCA 1510 can spread traffic across multiple queue pairs (QPs), such as Rx QPs 1514-1516, to allow for parallel processing (e.g. using multiple threads 1531-1533).

For example, the HCA 1510 can take advantage of a receive side scaling (RSS) filter 1507, which can spread traffic across multiple queue pairs (QPs) 1514-1516. The data service component 1505 can allocate the different threads 1531-1533 for processing the packets arriving on the QPs 1514-1516. Additionally, said QPs 1514-1516 may expose a hardware interface directly to the data service component 1505 bypassing an operating system on the node Furthermore, in order to minimize the overhead for data processing, the RSS filter 1507 can direct the different packets received from the same data flow to a single data service thread. Alternatively, the HCA 1510 can use other hash-based filters, or other types of filters, for spreading traffic across multiple queue pairs (QPs) 1514-1516 to allow for parallel processing. Additionally, the HCA 1510 can direct the data flow according to the core affinity, and can preserve the ordering of the packets within the data flow.

Then, the data service component 1505, e.g. a software FWL service, can process the incoming data packets, such as modifying the IB headers including the DLID information and/or inspecting packet headers and/or payload for filtering and monitoring purposes.

In accordance with an embodiment of the invention, the HCA 1510 can support raw mode packet forwarding. On the receiving side, the HCA 1510 can validate CRCs, can forward packets in raw format (with all IB headers) to multiple application level QPs without IB protocol termination, and can use a RSS filter 1507 for spreading load to multiple receiving queues (RQs). On the transmitting side, the packets processed by the data service component 1505 can be submitted to the HCA 1510 in raw format, e.g. via QPs 1517-1519. The HCA 1510 can generate CRCs, and allows an application to post packets in raw format (with all IB headers) from multiple application level QPs.

In accordance with an embodiment of the invention, the HCA 1510 can support a router usage model. If the DGID in the incoming packet matches a DGID for an ingress HCA port, then the packet can be processed according to the IB protocol. If the DGID in the incoming packet does not match any DGID for the ingress HCA ports, then the packet can be forwarded to one of the designated set of Rx QPs, where the packet can be inspected (and optionally modified) by the software running on the host node 1501 before forwarding to a destination node. When the host software determines that data packet should be forwarded, the entire packet (potentially with modified IB headers) can be sent using a send queue. The send queue can support raw packet where the HCA 1510 hardware (HW) can optionally generate a variant cyclic redundancy check (CRC) and an invariant cyclic redundancy check (CRC), while sending the packet.

In accordance with an embodiment of the invention, the HCA 1510 allows no software stack overhead, and can deliver packets directly to the processing threads with no need to copy data. Furthermore, the HCA 1510 may only touch necessary portions of headers. For example, the HCA 1510 can support header/data separation (or hits). Additionally, the HCA 1510 can take advantage of multiple per-processing thread dedicated queues for scaling out efficiently with multiple cores.

Additionally, the HCA 1510 can provide hardware assistance for cyclic redundancy check (CRC) validation 1521 and CRC generation 1522. Also, the HCA 1510 can perform an incremental invariant CRC update to take into account a P_Key, the value of which is modified directly in the packet or is modified via control interface (such as Work Request). Thus, the HCA 1510 can preserve data integrity characteristics of the IB payload and the HCA 1510 allows the modification of the IB P_Key for supporting isolation between two end points.

Figure 16:
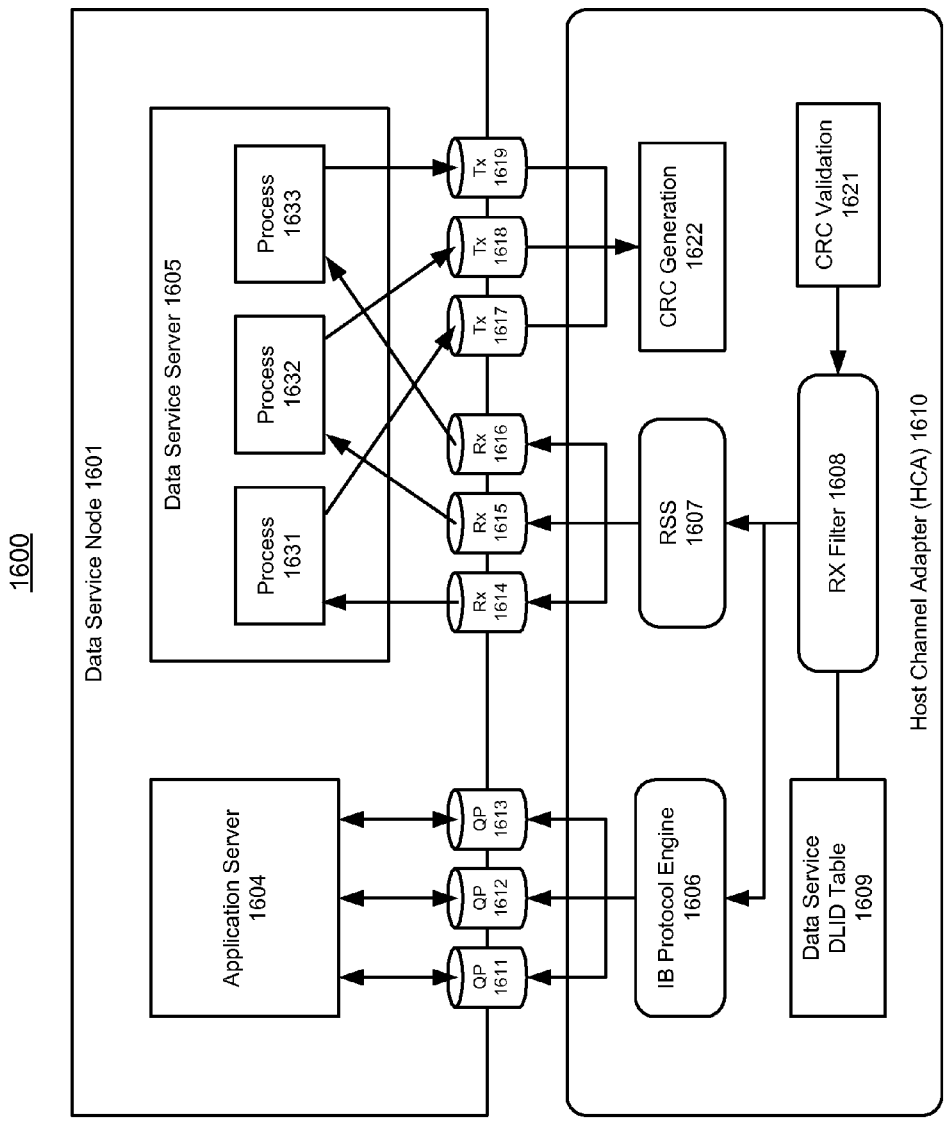
FIG. 16 shows an illustration of supporting host channel adaptor (HCA) filtering for providing data services in a non-virtualized environment, in accordance with an embodiment of the invention.

FIG. 16 shows an illustration of supporting host channel adaptor (HCA) filtering for providing data services in a non-virtualized environment, in accordance with an embodiment of the invention. As shown in FIG. 16, a data service node 1601 in a network environment 1600 can use a network connecting device, such as a host channel adaptor (HCA) 1610, for network connections.

The data service node 1601 can include an application server 1604, and a data service component (e.g. a data service server 1605). Furthermore, the data service node 1601 can receive a mixed data flow. The mixed data flow traffic may target either the application server 1604 or the data service server 1605.

As shown in FIG. 16, the data service node 1601 can be associated with the queue pairs (QPs) 1611-1619. The application server 1604 can be associated with the queue pairs (QPs) 1611-1613, and the data service server 1605 can be associated with the receiving (Rx) queue pairs (QPs) 1614-1616 and the transmitting (Tx) QPs 1617-1619.

In accordance with an embodiment of the invention, the data service node 1601 can use the HCA 1610 for providing filter capabilities (in a fashion similar to the virtualized environment as shown in FIG. 15).

As shown in FIG. 16, HCA 1610 can include a receiving (Rx) filter 1608, which can identify packets targeting the data service server 1605 without protocol termination. Thus, the HCA 1610 can separate the data flow traffic targeting the data service server 1605 from the data flow traffic targeting the application server 1604 (which uses an IB protocol engine 1606 to handle the IB packets according to the IB protocol).

In accordance with an embodiment of the invention, the HCA 1610 can spread traffic across multiple queue pairs (QPs), such as Rx QPs 1614-1616, to allow for parallel processing (e.g. using multiple threads 1631-1633). For example, the HCA 1610 can take advantage of a receive side scaling (RSS) filter 1607, which can spread traffic across multiple queue pairs (QPs) 1614-1616. The data service server 1605 can allocate the different processes 1631-1633 for processing the packets arriving on the QPs 1614-1616.

In accordance with an embodiment of the invention, the HCA 1610 can support raw mode packet forwarding. Additionally, the HCA 1610 can provide hardware assistance for cyclic redundancy check (CRC) validation 1621 and CRC generation 1622.

On the receiving side, the HCA 1610 can validate CRCs, can forward packets in raw format (with all IB headers) to multiple application level QPs without IB protocol termination, and can use a RSS filter 1607 for spreading load to multiple receiving queues (RQs). On the transmitting side, the packets processed by the data service component 1605 can be submitted to the HCA 1610 in raw format, e.g. via QPs 1617-1619. The HCA 1610 can generate CRCs, and allows an application to post packets in raw format (with all IB headers) from multiple application level QPs.

Figure 17:
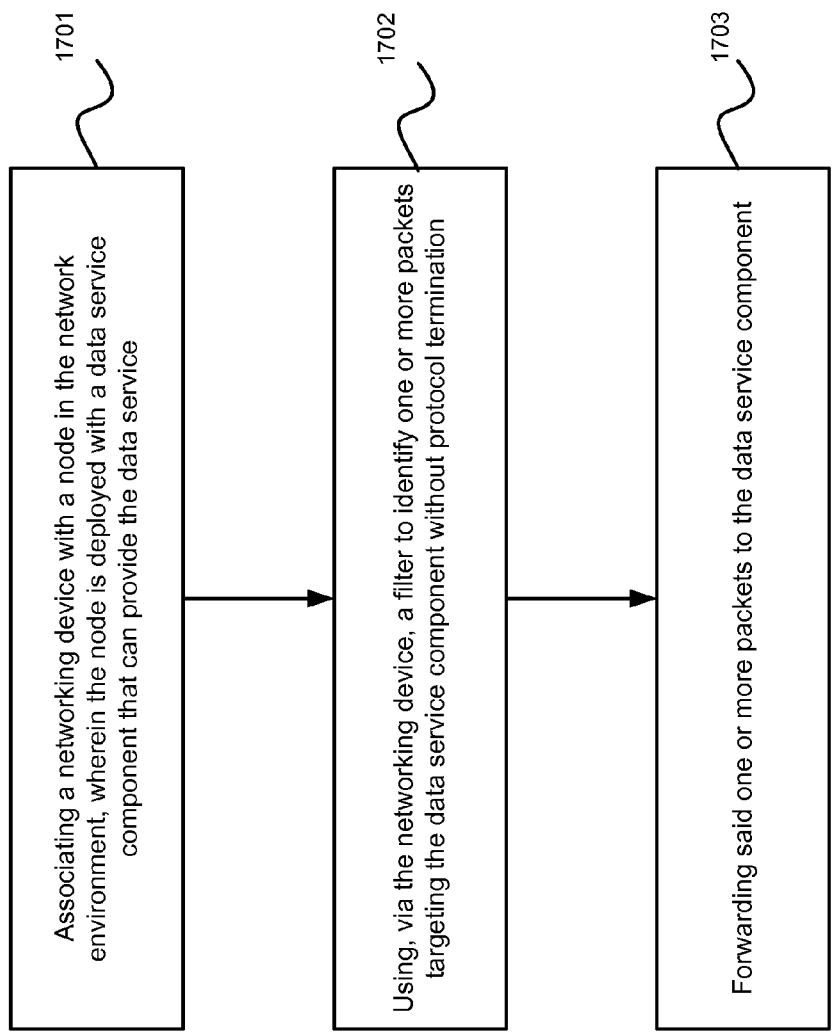
FIG. 17 illustrates an exemplary flow chart for supporting HCA filtering for providing data services in a network environment, in accordance with an embodiment of the invention.

FIG. 17 illustrates an exemplary flow chart for supporting HCA filtering for providing data service in a network environment, in accordance with an embodiment of the invention. As shown in FIG. 17, at step 1701, the system can associate a networking device with a node in the network environment, wherein the node is deployed with a data service component that can provide a data service. Then, at step 1702, the networking device can use a filter to identify one or more packets targeting the data service component without protocol termination. Furthermore, at step 1703, the filter can forward said one or more packets to the data service component.

Many features of the present invention can be performed in, using, or with the assistance of hardware, software, firmware, or combinations thereof. Consequently, features of the present invention may be implemented using a processing system (e.g., including one or more processors).

Features of the present invention can be implemented in, using, or with the assistance of a computer program product which is a storage medium (media) or computer readable medium (media) having instructions stored thereon/in which can be used to program a processing system to perform any of the features presented herein. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the machine readable medium (media), features of the present invention can be incorporated in software and/or firmware for controlling the hardware of a processing system, and for enabling a processing system to interact with other mechanism utilizing the results of the present invention. Such software or firmware may include, but is not limited to, application code, device drivers, operating systems and execution environments/containers.

Features of the invention may also be implemented in hardware using, for example, hardware components such as application specific integrated circuits (ASICs). Implementation of the hardware state machine so as to perform the functions described herein will be apparent to persons skilled in the relevant art.

Additionally, the present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The foregoing description of the present invention has been provided for the purposes of illustration and description. It is not intended to be exhaustive or to limit the invention to the precise forms disclosed. The breadth and scope of the present invention should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A system for providing a data service in a network environment, comprising:
    one or more microprocessors;
    a node, running on said one or more microprocessors, wherein the node includes a data service component executing on the node that operates to provide the data service; and
    a networking device, associated with the node that operates to
        receive a mixed data flow of packets, wherein all of the received packets are targeted to the node, and wherein only some of the received packets are targeted to the data service component executing on the node;
        use a filter of the network device to identify the received packets targeted to the data service component executing on the node; and
        forward the received packets targeted to the data service component executing on the node in raw format, including all packet headers.

2. The system according to claim 1, wherein:
    said data service component is deployed in one of
        a virtual machine as a virtual appliance, and
        a dedicated node.

3. The system according to claim 1, wherein:
    the data service component provides at least one of a firewall (FWL) service and traffic routing service.

4. The system according to claim 1, wherein:
    said filter is based on at least one of
        filtering a destination local identifier (DLID) in each said packet,
        filtering a destination global identifier (DGID) in each said packet, and
        invert filtering.

5. The system according to claim 1, wherein:
    the data service component operates to process said one or more packets, and the networking device operates to transmit the processed packets to one or more destination nodes.

6. The system according to claim 1, wherein:
    the node is associated with a plurality of queue pairs (QPs), wherein one or more said QPs are associated with an application server, and one or more said QPs are associated with the data service component.

7. The system according to claim 1, wherein:
    the networking device operates to separate a traffic targeting the data service component from a traffic targeting the application server.

8. The system according to claim 1, wherein:
    the network environment is based on an Infiniband protocol and the networking device is a host channel adaptor (HCA).

9. The system according to claim 1, wherein:
    the networking device operates to perform cyclic redundancy check (CRC) validation and CRC generation on the one or more packets, and wherein the networking device operates to perform incremental CRC update for the invariant CRC to preserve end-to-end data integrity when a transport header is updated.

10. The system according to claim 7, wherein:
    the networking device operates to spread traffic targeting the data service component across multiple QPs for parallel processing, and wherein said QPs operates to expose a hardware interface directly to the data service component bypassing an operating system on the node.

11. A method for providing a data service in a network environment, comprising:
    associating a networking device with a node in the network environment, wherein the node is deployed with a data service component that executes on the node and that provides the data service;
    receiving, at the network device, a mixed data flow of packets, wherein all of the packets in the mixed data flow are targeted to the node, and wherein only some of the received packets are targeted to the data service component executing on the node;

using a filter of the network device to identify the received packets targeted to the data service component executing on the node; and forwarding the received packets targeted to the data service component executing on the node in raw format, including all packet headers.

12. The method according to claim 11, further comprising:

deploying said data service component in one of
a virtual machine as a virtual appliance, and
a dedicated node.

13. The method according to claim 11, further comprising:

allowing the data service component to provide at least one of a firewall (FWL) service and traffic routing service.

14. The method according to claim 11, further comprising:

allowing said filter to be based on at least one of
filtering a destination local identifier (DLID) in each said packet,
filtering a destination global identifier (DGID) in each said packet, and
invert filtering.

15. The method according to claim 11, further comprising:

allowing the data service component to process said one or more packets, and
transmitting the processed packets to one or more destination nodes.

16. The method according to claim 15, further comprising:

associating the node with a plurality of queue pairs (QPs), wherein one or more said QPs are associated with the application server, and one or more said QPs are associated with the data service component.

17. The method according to claim 15, wherein the networking device operates to separate a traffic targeting the data service component from a traffic targeting the application server.

18. The method according to claim 17, further comprising:

allowing the network environment to be based on an Infiniband protocol, and
allowing the networking device to be a host channel adaptor (HCA).

19. The method according to claim 17, further comprising:

allowing the networking device to at least one of
perform cyclic redundancy check (CRC) validation and CRC generation on the one or more packets,
perform incremental CRC update for the invariant CRC to preserve end-to-end data integrity when a transport header is updated,
spread traffic targeting the data service component across multiple QPs for parallel processing, and
allow one or more QPs to expose a hardware interface directly to the data service component bypassing an operating system on the node.

20. A non-transitory machine readable storage medium having instructions stored thereon that when executed cause a system to perform the steps comprising:

associating a networking device with a node in the network environment, wherein the node is deployed with a data service component that executes on the node and that provides the data service;

receiving, at the network device, a mixed data flow of packets, wherein all of the packets in the mixed data flow are targeted to the node, and wherein only some of the received packets are targeted to the data service component executing on the node;

using a filter of the network device to identify the received packets targeted to the data service component executing on the node; and forwarding the received packets targeted to the data service component executing on the node in raw format, including all packet headers.

* * * * *

UNITED STATES PATENT AND TRADEMARK OFFICE
CERTIFICATE OF CORRECTION

PATENT NO. : 9,559,990 B2
APPLICATION NO. : 14/467896
DATED : January 31, 2017
INVENTOR(S) : Makhervaks et al.

Page 1 of 1

It is certified that error appears in the above-identified patent and that said Letters Patent is hereby corrected as shown below:

In the Specification

In Column 7, Line 34, after "subnets)" insert -- . --.

In Column 14, Line 36, delete "(BOW)" and insert -- (BoW) --, therefor.

In Column 14, Line 56, after "node" insert -- . --.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*